United States Patent
Lee et al.

(10) Patent No.: US 12,432,993 B2
(45) Date of Patent: Sep. 30, 2025

(54) INTEGRATED CIRCUIT DEVICES

(71) Applicant: SAMSUNG ELECTRONICS CO., LTD., Suwon-si (KR)

(72) Inventors: Juri Lee, Suwon-si (KR); Taegon Kim, Suwon-si (KR); Seungmo Kang, Suwon-si (KR); Sihyung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 442 days.

(21) Appl. No.: 18/155,532

(22) Filed: Jan. 17, 2023

(65) Prior Publication Data
US 2023/0387207 A1 Nov. 30, 2023

(30) Foreign Application Priority Data
May 25, 2022 (KR) .................. 10-2022-0064253

(51) Int. Cl.
*H10D 62/13* (2025.01)
*H01L 21/265* (2006.01)
(Continued)

(52) U.S. Cl.
CPC ..... *H10D 62/151* (2025.01); *H01L 21/26506* (2013.01); *H10D 30/014* (2025.01);
(Continued)

(58) Field of Classification Search
CPC .. H10D 62/151; H10D 30/014; H10D 30/031; H10D 30/43; H10D 30/6729;
(Continued)

(56) References Cited

U.S. PATENT DOCUMENTS 7,718,500 B2  5/2010  Chong et al.
8,415,250 B2  4/2013  Alptekin et al.
(Continued)

FOREIGN PATENT DOCUMENTS

KR  20060094379 A   8/2006
KR   100781541 B1  12/2007
KR   101130331 B1   3/2012

OTHER PUBLICATIONS

Gibbons, James F., "Ion Implantation in Semiconductors—Part I Range Distribution Theory and Experiments", Proceedings of the IEEE, vol. 56, No. 3, Mar. 1968, pp. 295-319.

*Primary Examiner* — Mohammad A Rahman
(74) *Attorney, Agent, or Firm* — Wolf, Greenfield & Sacks, P.C.

(57) ABSTRACT

An integrated circuit (IC) device includes a fin-type active region extending long in a first lateral direction on a substrate, a channel region on the fin-type active region, a gate line surrounding the channel region, and a source/drain region adjacent to the gate line on the fin-type active region, the source/drain region. The source/drain region includes a lower source/drain region and an upper source/drain region. The lower source/drain region includes at least one silicon isotope selected from silicon isotopes of $^{28}$Si, $^{29}$Si, and $^{30}$Si, and the upper source/drain region includes a $^{28}$Si element at a content higher than a content of the $^{28}$Si element in the lower source/drain region.

20 Claims, 32 Drawing Sheets

(51) Int. Cl.
  *H10D 30/01* (2025.01)
  *H10D 30/43* (2025.01)
  *H10D 30/67* (2025.01)
  *H10D 62/10* (2025.01)
  *H10D 62/83* (2025.01)
  *H10D 84/83* (2025.01)

(52) U.S. Cl.
  CPC ........... *H10D 30/031* (2025.01); *H10D 30/43* (2025.01); *H10D 30/6729* (2025.01); *H10D 62/83* (2025.01); *H10D 84/83* (2025.01); *H10D 62/121* (2025.01)

(58) Field of Classification Search
  CPC ...... H10D 62/83; H10D 84/83; H10D 62/121; H10D 30/6757; H10D 30/797; H10D 30/6735; H10D 64/017; H10D 64/256; H10D 62/822; H10D 84/013; H10D 84/038; H10D 84/834; H01L 21/26506; B82Y 10/00
  See application file for complete search history.

(56) References Cited

U.S. PATENT DOCUMENTS

| | | |
|---|---|---|
| 8,928,090 B2 | 1/2015 | Seo et al. |
| 9,490,345 B2 | 11/2016 | Chen et al. |
| 9,543,387 B2 | 1/2017 | Chang et al. |
| 10,084,063 B2 | 9/2018 | Kuang et al. |
| 2016/0149003 A1 | 5/2016 | Choi et al. |
| 2021/0082914 A1* | 3/2021 | Lee .................... H10D 84/0147 |

* cited by examiner

INTEGRATED CIRCUIT DEVICES

CROSS-REFERENCE TO RELATED APPLICATION

This application is based on and claims priority under 35 U.S.C. § 119 to Korean Patent Application No. 10-2022-0064253, filed on May 25, 2022, in the Korean Intellectual Property Office, the disclosure of which is incorporated by reference herein in its entirety.

BACKGROUND

The inventive concept relates to integrated circuit (IC) devices, and more particularly, to IC devices including a fin field-effect transistor (FinFET).

In recent years, as the downscaling of IC devices has progressed, it has become desirable to ensure not only a high operating speed but also high operating accuracy in IC devices. In addition, as the integration density of IC devices has increased and the sizes of IC devices have been reduced, it has become desirable to develop structures capable of improving the performance and reliability of field-effect transistors (FETs) having fin-type active regions.

SUMMARY

The inventive concept provides an integrated circuit (IC) device having a structure capable of improving the performance of a field-effect transistor (FET) having a fin-type active region and improving the reliability of the IC device including the FET.

According to an aspect of the inventive concept, there is provided an IC device including a fin-type active region extending long in a first lateral direction on a substrate, a channel region on the fin-type active region, a gate line surrounding the channel region on the fin-type active region, the gate line extending long in a second lateral direction, wherein the second lateral direction intersects with the first lateral direction, and a source/drain region adjacent to the gate line on the fin-type active region, the source/drain region having a sidewall facing the channel region, wherein the source/drain region includes a lower source/drain region having a bottom surface in contact with the fin-type active region, the lower source/drain region including at least one silicon isotope selected from silicon isotopes including $^{28}Si$, $^{29}Si$, and $^{30}Si$, and an upper source/drain region that is integral (e.g., integrally connected) to the lower source/drain region on the lower source/drain region, the upper source/drain region including a $^{28}Si$ element at a content higher than a content of the $^{28}Si$ element in the lower source/drain region.

According to another aspect of the inventive concept, there is provided an IC device including a fin-type active region extending long in a first lateral direction on a substrate, a recess formed in the fin-type active region, a pair of channel regions on the fin-type active region with the recess therebetween, a pair of gate lines extending long in a second lateral direction on the fin-type active region, the pair of gate lines being spaced apart from each other in the first lateral direction with the recess therebetween, wherein the second lateral direction intersects with the first lateral direction, and a source/drain region in the recess, the source/drain region being in contact with the pair of channel regions, wherein the source/drain region includes a lower source/drain region having a bottom surface in contact with the fin-type active region, the lower source/drain region including at least one silicon isotope selected from silicon isotopes including $^{28}Si$, $^{29}Si$, and $^{30}Si$, and an upper source/drain region that is integral (e.g., integrally connected) to the lower source/drain region on the lower source/drain region, the upper source/drain region including a $^{28}Si$ element at a content higher than a content of the $^{28}Si$ element in the lower source/drain region.

According to another aspect of the inventive concept, there is provided an IC device including a plurality of fin-type active regions extending long in a first lateral direction on a substrate, a plurality of recesses formed in upper portions of the plurality of fin-type active regions, respectively, a plurality of channel regions on the plurality of fin-type active regions, a plurality of gate lines on the plurality of channel regions, the plurality of gate lines extending long in a second lateral direction, wherein the second lateral direction intersects with the first lateral direction, a plurality of source/drain regions in the plurality of recesses, a plurality of source/drain contacts on the plurality of source/drain regions, each source/drain contact having a lower portion surrounded by a selected one of the plurality of source/drain regions, and a plurality of metal silicide films between the plurality of source/drain regions and the plurality of source/drain contacts, respectively, wherein each of the plurality of source/drain regions includes a lower source/drain region having a bottom surface in contact with a selected one of the plurality of fin-type active regions, the lower source/drain region including at least one silicon isotope selected from silicon isotopes including $^{28}Si$, $^{29}Si$, and $^{30}Si$, and an upper source/drain region that is integral (e.g., integrally connected) to the lower source/drain region on the lower source/drain region, the upper source/drain region including a $^{28}Si$ element at a content higher than a content of the $^{28}Si$ element in the lower source/drain region.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
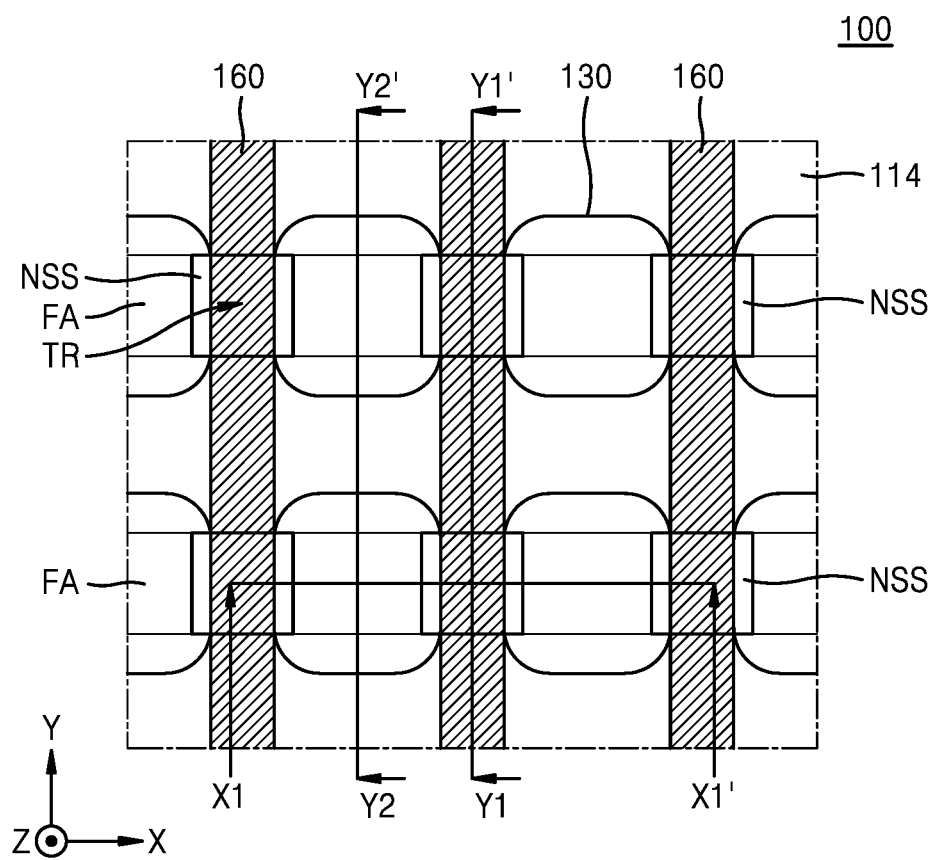
FIG. 1 is a plan layout diagram of some components of an integrated circuit (IC) device according to embodiments.

Hereinafter, embodiments will be described in detail with reference to the accompanying drawings. The same reference numerals are used to denote the same elements in the drawings, and repeated descriptions thereof are omitted.

Figure 2A:
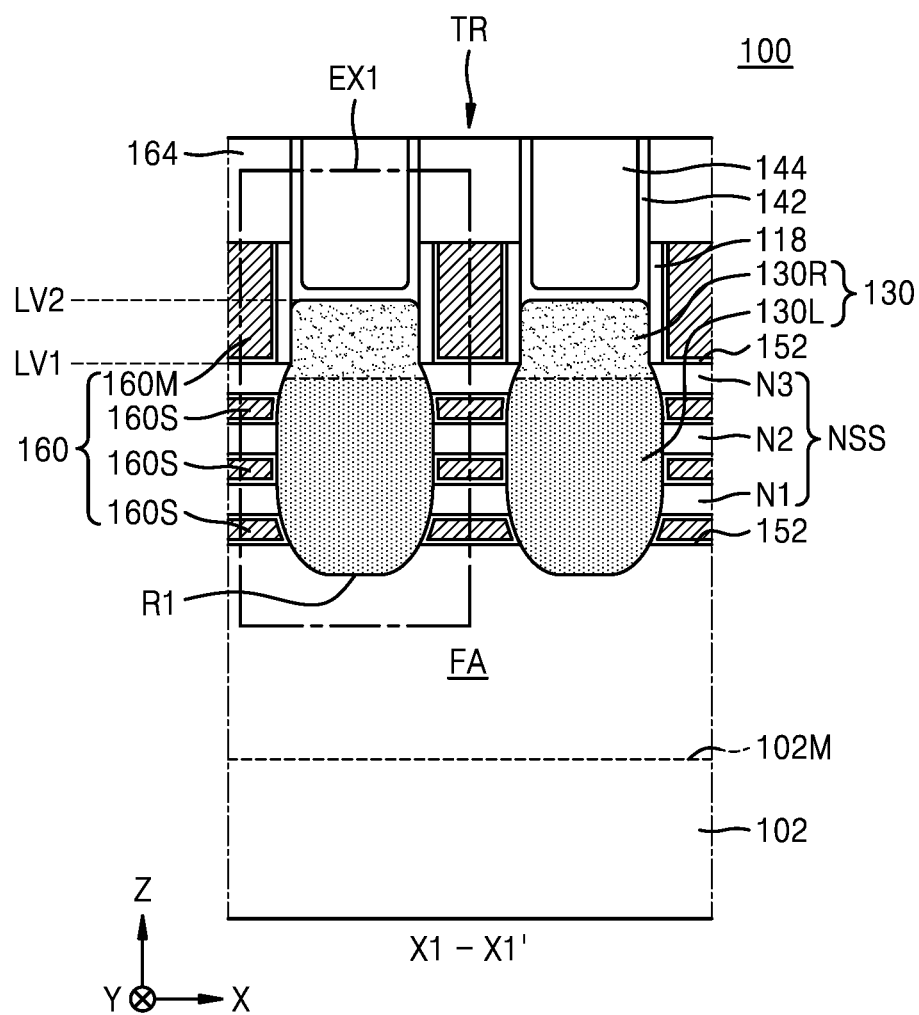
FIG. 2A is a cross-sectional view taken along line X1-X1' of FIG. 1.
Figure 2B:
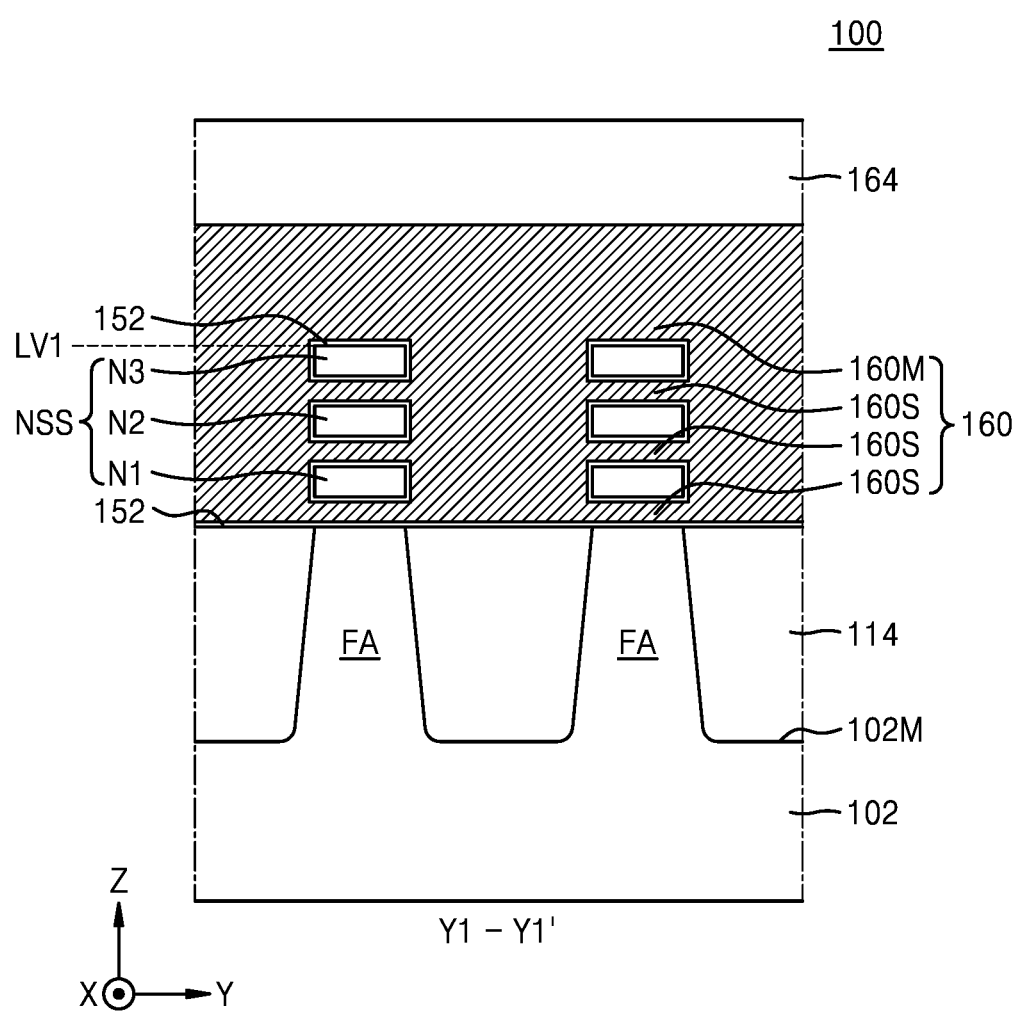
FIG. 2B is a cross-sectional view taken along line Y1-Y1' of FIG. 1.
Figure 2C:
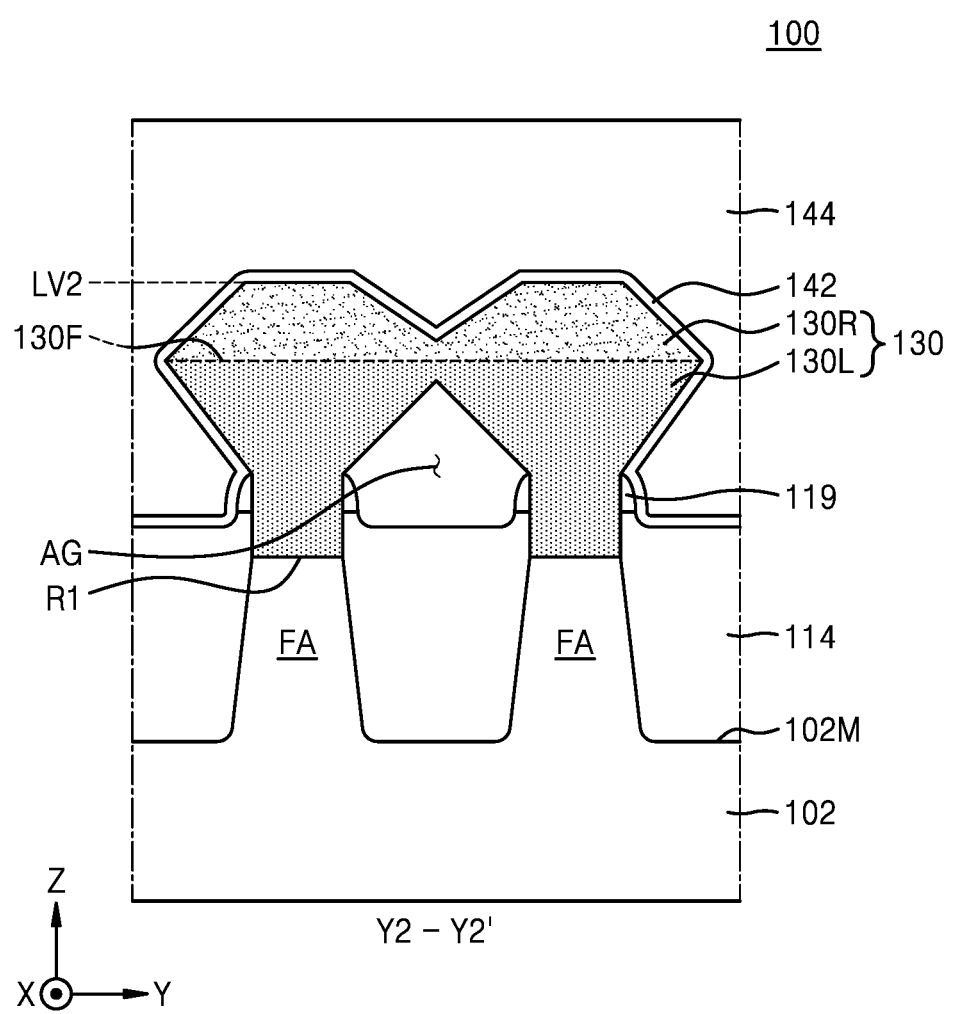
FIG. 2C is a cross-sectional view taken along line Y2-Y2' of FIG. 1.
Figure 2D:
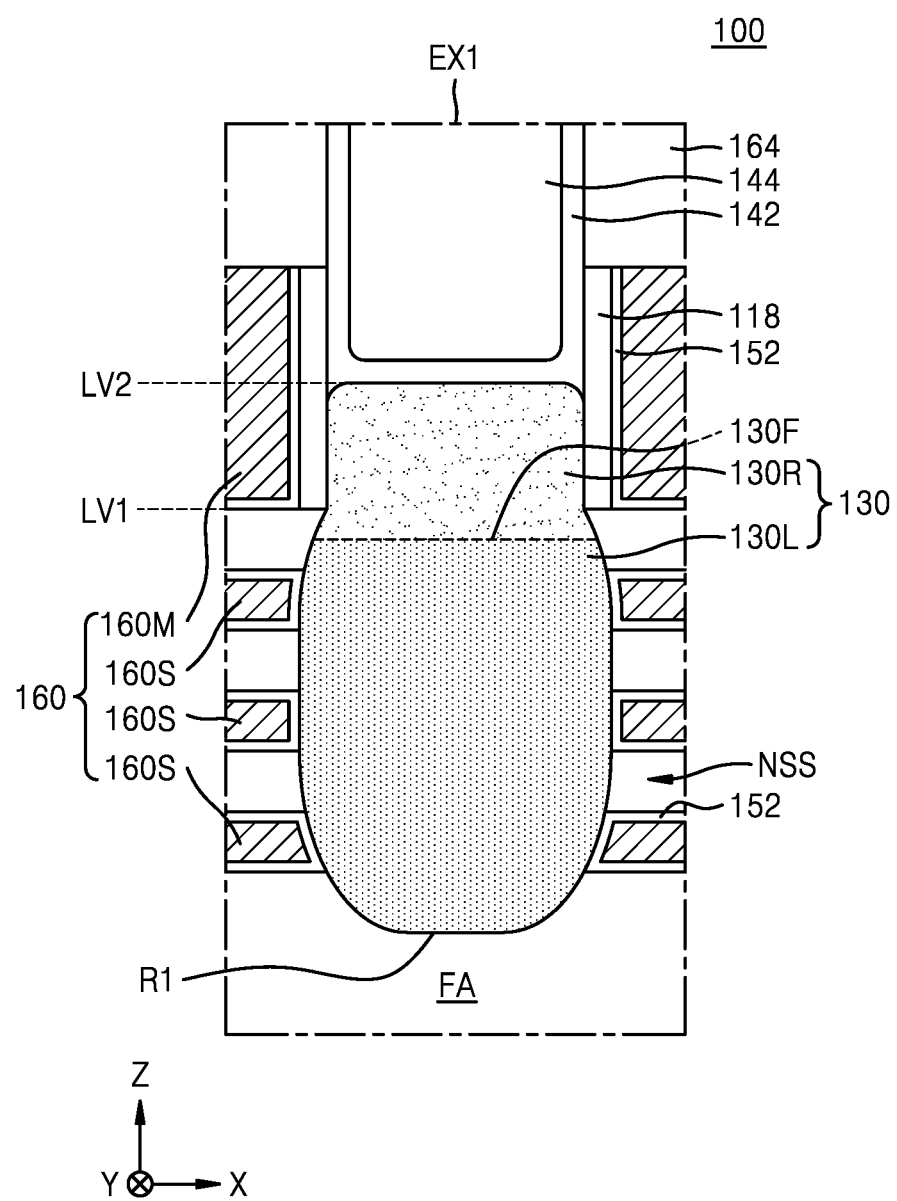
FIG. 2D is an enlarged cross-sectional view of a local region "EX1" of FIG. 2A.

FIG. 1 is a plan layout diagram of some components of an integrated circuit (IC) device 100 according to embodiments. FIG. 2A is a cross-sectional view taken along line X1-X1' of FIG. 1. FIG. 2B is a cross-sectional view taken along line Y1-Y1' of FIG. 1. FIG. 2C is a cross-sectional view taken along line Y2-Y2' of FIG. 1. FIG. 2D is an enlarged cross-sectional view of a local region "EX1" of FIG. 2A. The IC device 100 including a field-effect transistor (FET) TR having a gate-all-around structure including an active region of a nanowire or nanosheet type and a gate surrounding the active region will now be described with reference to FIGS. 1 and 2A to 2D.

Referring to FIGS. 1 and 2A to 2D, the IC device 100 may include a plurality of fin-type active regions FA and a plurality of nanosheet stacks NSS. The plurality of fin-type active regions FA may protrude upward from a substrate 102 in a vertical direction (Z direction) and extend long in a first lateral direction (X direction). The plurality of nanosheet stacks NSS may be on the plurality of fin-type active regions FA. As used herein, the term "nanosheet" refers to a conductive structure having a cross-section that is substantially perpendicular to a direction in which current flows. The nanosheet may be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A device isolation film (refer to 114 in FIGS. 1, 2B, and 2C) may be on the substrate 102 to cover both sidewalls of each of the plurality of fin-type active regions FA. Covering may mean being on a surface hereinafter. The device isolation film 114 may include an oxide film, a nitride film, or a combination thereof.

A plurality of gate lines 160 may be on the plurality of fin-type active regions FA. Each of the plurality of gate lines 160 may extend in a second lateral direction (Y direction), which intersects with the first lateral direction (X direction). The plurality of nanosheet stacks NSS may be respectively on the plurality of fin-type active regions FA in regions where the plurality of fin-type active regions FA intersect with the plurality of gate lines 160. Each of the plurality of nanosheet stacks NSS may include a plurality of nanosheets (e.g., a first nanosheet N1, a second nanosheet N2, and a third nanosheet N3), which overlap each other in the vertical direction (Z direction) on the fin-type active region FA. The first nanosheet N1, the second nanosheet N2, and the third nanosheet N3 may be at different vertical distances (Z-directional distances) from a top surface of the fin-type active region FA.

FIG. 1 illustrates a case in which the nanosheet stack NSS approximately has a rectangular planar shape, without being limited thereto. The nanosheet stack NSS may have various planar shapes according to a planar shape of each of the fin-type active region FA and the gate line 160. The present example pertains to a configuration in which the plurality of nanosheet stacks NSS and the plurality of gate lines 160 are formed on one fin-type active region FA, and the plurality of nanosheet stacks NSS are arranged in a line in the first lateral direction (X direction) on one fin-type active region FA. However, according to embodiments, the numbers of nanosheet stacks NSS and gate lines 160 on one fin-type active region FA are not specifically limited.

Each of the first to third nanosheets N1, N2, and N3 included in the nanosheet stack NSS may have a channel region. For example, each of the first to third nanosheets N1, N2, and N3 may have a thickness selected in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction).

In embodiments, at least some of the first to third nanosheets N1, N2, and N3 included in one nanosheet stack NSS may have different sizes in the first lateral direction (X direction). In other embodiments, at least some of the first to third nanosheets N1, N2, and N3 may have the same size in the first lateral direction (X direction).

A plurality of recesses R1 may be formed in the fin-type active region FA. As shown in FIG. 2A, a lowermost surface of each of the plurality of recesses R1 may be at a lower vertical level than the top surface of the fin-type active region FA. As used herein, the term "vertical level" refers to a height from a main surface 102M of the substrate 102 in a vertical direction (Z direction or −Z direction).

A plurality of source/drain regions 130 may be respectively in the plurality of recesses R1. Each of the plurality of source/drain regions 130 may be adjacent to at least one gate line 160 selected from the plurality of gate lines 160. Each of the plurality of source/drain regions 130 may have sidewalls facing the first to third nanosheets N1, N2, and N3 included in the nanosheet stack NSS adjacent thereto. As a result each of the plurality of source/drain regions 130 may have a sidewall facing the channel region included in the nanosheet stack NSS. Each of the plurality of source/drain regions 130 may be in contact with the first to third nanosheets N1, N2, and N3 included in the nanosheet stack NSS adjacent thereto. The term "in contact with" may mean that no intervening elements are present between the elements being in contact with each other.

Each of the plurality of source/drain regions 130 may include a lower source/drain region 130L having a bottom surface in contact with the fin-type active region FA and an upper source/drain region 130R on the lower source/drain region 130L. The upper source/drain region 130R may be integral (e.g., integrally connected) to the lower source/drain region 130L. The lower source/drain region 130L may include at least one silicon isotope selected from silicon isotopes including $^{28}$Si, $^{29}$Si, and $^{30}$Si. The upper source/drain region 130R may include a $^{28}$Si element at a higher content than a content of the $^{28}$Si element in the lower source/drain region 130L. As used herein, the term "$^{28}$Si" refers to a silicon atom having a unified atomic mass unit (AMU) of 28, "$^{29}$Si" refers to a silicon atom having an AMU of 29, and "$^{30}$Si" refers to a silicon atom having an AMU of 30. As used herein, the term "content" refers to an atomic percent occupied by an element per unit volume.

In embodiments, a content of a $^{28}$Si element in the upper source/drain region 130R may be higher than a content of the $^{28}$Si element in a silicon film existing in nature. For example, the upper source/drain region 130R may include a silicon film including at least about 80 at % of $^{28}$Si element, a SiC film including at least about 50 at % of $^{28}$Si element, or a SiGe film including at least about at % of $^{28}$Si element. In other embodiments, a content of the $^{28}$Si element in the upper source/drain region 130R may be at least about 10 at %, at least about 15 at %, at least about 20 at %, at least about 25 at %, at least about 30 at %, at least about 35 at %, at least about 40 at %, at least about 45 at %, at least about 50 at %, at least about 55 at %, at least about 60 at %, at least about at %, at least about 70 at %, at least about 75 at %, at least about 80 at %, at least about 85 at %, at least about 90 at %, at least about 95 at %, at least about 97 at %, at least about 98 at %, at least about 99 at %, or about 100 at %. In other embodiments, the content of the $^{28}$Si element in the upper source/drain region 130R may be in a range of about 30 at % to about 95 at % based on a total weight of silicon isotopes in the upper source/drain region 130R. However, a content of the $^{28}$Si element in the upper source/drain region 130R is not limited to the examples described above.

In embodiments, in each of the plurality of source/drain regions 130, the lower source/drain region 130L may include an epitaxially grown semiconductor layer, and the upper source/drain region 130R may include a semiconductor layer obtained by additionally doping a $^{28}$Si element into an epitaxially grown semiconductor layer. In embodiments, in each of the plurality of source/drain regions 130, the lower source/drain region 130L may include a Group-IV element semiconductor, a Group IV-IV compound semiconductor, or a combination thereof. In embodiments, in each of the plurality of source/drain regions 130, the lower source/drain region 130L may include a silicon (Si) layer doped with an n-type dopant, a silicon carbide (SiC) layer doped with an n-type dopant, or a silicon germanium (SiGe) layer doped with a p-type dopant. The n-type dopant may be selected from phosphorus (P), arsenic (As), and antimony (Sb). The p-type dopant may be selected from boron (B) and gallium (Ga). However, a dopant included in the lower source/drain region 130L is not limited to the examples described above. Silicon atoms included in the lower source/drain region 130L may be selected from silicon isotopes including $^{28}$Si, $^{29}$Si, and $^{30}$Si. In each of the plurality of source/drain regions 130, similar to the lower source/drain region 130L, the upper source/drain region 130R may include a semiconductor layer, which includes a silicon (Si) layer doped with an n-type dopant, a silicon carbide (SiC) layer doped with an n-type dopant, or a silicon germanium (SiGe) layer doped with a p-type dopant and is additionally doped with a $^{28}$Si element.

In embodiments, in each of the plurality of source/drain regions 130, each of the lower source/drain region 130L and the upper source/drain region 130R may include single crystalline silicon doped with an n-type dopant. The lower source/drain region 130L may include $^{28}$Si at a first content higher than about 0 at %, and the upper source/drain region 130R may include $^{28}$Si at a second content higher than the first content.

In other embodiments, in each of the plurality of source/drain regions 130, each of the lower source/drain region 130L and the upper source/drain region 130R may include a silicon germanium (SiGe) layer doped with a p-type dopant. The lower source/drain region 130L may include $^{28}$Si at a first content higher than about 0 at %, and the upper source/drain region 130R may include $^{28}$Si at a second content higher than the first content.

As shown in FIGS. 2A and 2B, each of the plurality of gate lines 160 may surround each of the first to third nanosheets N1, N2, and N3 while covering the nanosheet stack NSS on the fin-type active region FA. Each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integral (e.g., integrally connected) to the main gate portion 160M and respectively arranged between the first to third nanosheets N1, N2, and N3 and between the first nanosheet N1 and the fin-type active region FA. In the vertical direction (Z direction), a thickness of each of the plurality of sub-gate portions 160S may be less than a thickness of the main gate portion 160M.

Each of the gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In embodiments, the interface dielectric film may be omitted. The high-k dielectric film may include a material having a higher dielectric constant than a silicon oxide film. For example, the high-k dielectric film may have a dielectric constant of about 10 to 25. The high-k dielectric film may include hafnium oxide, without being limited thereto.

A plurality of field-effect transistors (FETs) TR may be formed in regions where the plurality of fin-type active regions FA intersect with the plurality of gate lines 160 on the substrate 102. The plurality of FETs TR may constitute a logic circuit or a memory device.

In embodiments, the first to third nanosheets N1, N2, and N3 may include a semiconductor layer including the same elements. In an example, each of the first to third nanosheets N1, N2, and N3 may include a silicon layer. In embodiments, the first to third nanosheets N1, N2, and N3 may include an undoped silicon layer. In other embodiments, the first to third nanosheets N1, N2, and N3 may include a silicon layer doped with a dopant of the same conductivity type as that of the source/drain region 130. In other embodiments, the first to third nanosheets N1, N2, and N3 may include a silicon layer doped with a dopant of a conductivity type opposite to that of the source/drain region 130.

As shown in FIGS. 2A and 2D, in each of the plurality of source/drain regions 130, the lower source/drain region 130L may be in contact with the fin-type active region FA, which forms a bottom surface of the recess R1. In each of the plurality of source/drain regions 130, the upper source/drain region 130R may have a top surface, which is at a vertical level LV2 that is higher than a vertical level LV1 of an uppermost surface of the nanosheet stack NSS including the channel region (i.e., an uppermost surface of the third nanosheet N3). A boundary 130F between the lower source/drain region 130L and the upper source/drain region 130R may be at a vertical level lower than the vertical level LV1 of the uppermost surface of the nanosheet stack NSS including the channel region (i.e., the uppermost surface of the third nanosheet N3).

As shown in FIGS. 2A, 2B, and 2D, a plurality of outer insulating spacers 118 covering both sidewalls of the gate line 160 may be on the fin-type active region FA and the device isolation film 114. The plurality of outer insulating spacers 118 may cover the main gate portion 160M on top surfaces of the plurality of nanosheet stacks NSS. Each of the plurality of outer insulating spacers 118 may be apart from the gate line 160 with the gate dielectric film 152 therebetween. A top surface of each of the gate dielectric film 152, the gate lines 160, and the outer insulating spacers 118 may be covered by a capping insulating pattern 164. The capping insulating pattern 164 may include a silicon nitride film.

As shown in FIG. 2C, a plurality of recess-side insulating spacers 119 covering sidewalls of the lower source/drain regions 130L included in the source/drain region 130 may be on a top surface of the device isolation film 114. In embodiments, each of the plurality of recess-side insulating spacers 119 may be integral (e.g., integrally connected) to the outer insulating spacer 118 adjacent thereto. An air gap AG may be in a space defined by the recess-side insulating spacer 119 and the source/drain region 130 and the device isolation film 114, which are adjacent to the recess-side insulating spacer 119.

Each of the plurality of outer insulating spacers 118 and the plurality of recess-side insulating spacers 119 may include silicon nitride (SiN), silicon oxide (SiO), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiN," "SiO," "SiCN," "SiBN," "SiON," "SiOCN," "SiBCN," and "SiOC" refers to a material including elements included therein, without referring to a chemical formula representing a stoichiometric relationship.

As shown in FIGS. 2A and 2D, each of the plurality of source/drain regions 130 may include a portion, which overlaps the outer insulating spacer 118 in the vertical direction (Z direction). For example, a portion of each of the plurality of source/drain regions 130, which overlaps the outer insulating spacer 118 in the vertical direction (Z direction), may have a width ranging from about 0 nm to about 4 nm in the first lateral direction (X direction), without being limited thereto.

Between the first to third nanosheets N1, N2, and N3 and between the first nanosheet N1 and the fin-type active region FA, both sidewalls of each of the plurality of sub-gate portions 160S may be apart from the source/drain region 130 with the gate dielectric film 152 therebetween. The gate dielectric film 152 may include a portion in contact with the lower source/drain region 130L of the source/drain region 130. Each of the plurality of source/drain regions 130 may face the nanosheet stack NSS and the plurality of sub-gate portions 160S in the first lateral direction (X direction). The upper source/drain region 130R of the source/drain region 130 may include a portion in contact with the third nanosheet N3 and a portion in contact with the outer insulating spacer 118.

As shown in FIGS. 2A, 2C, and 2D, the plurality of outer insulating spacers 118 and the plurality of source/drain regions 130 may be covered by an insulating liner 142. The insulating liner 142 may include SiN, SiO, SiCN, SiBN, SiON, SiOCN, SiBCN, SiOC, or a combination thereof. In embodiments, the insulating liner 142 may be omitted. An inter-gate dielectric film 144 may be on the insulating liner 142. The inter-gate dielectric film 144 may include a silicon nitride film, a silicon oxide film, SiON, SiOCN, or a combination thereof. When the insulating liner 142 is omitted, the inter-gate dielectric film 144 may be in contact with the plurality of source/drain regions 130.

In the IC device 100, each of the plurality of source/drain regions 130 may include the upper source/drain region 130R including the $^{28}$Si element at a content higher than the content of the $^{28}$Si element in the lower source/drain region 130L. The top surface of the upper source/drain region 130R may be at the vertical level LV2 higher than the vertical level LV1 of the uppermost surface of the nanosheet stack. Accordingly, the upper source/drain region 130R may include a portion in a space between a pair of gate lines 160, which are adjacent to each other, from among the plurality of gate lines 160.

As described above, because an upper local region of the source/drain region 130 includes the upper source/drain region 130R having an elevated top surface, a process of electrically connecting the source/drain region 130 to a wiring structure (e.g., a source/drain contact) formed thereon may be easily performed during the manufacture of the IC device 100. Accordingly, the reliability of electrical connection between the source/drain region 130 and the wiring structure connected to the source/drain region 130 may be improved. Therefore, the performance of the FET TR including the source/drain region 130 may be improved, and the reliability of the IC device 100 including the source/drain region 130 may be improved.

Figure 3A:
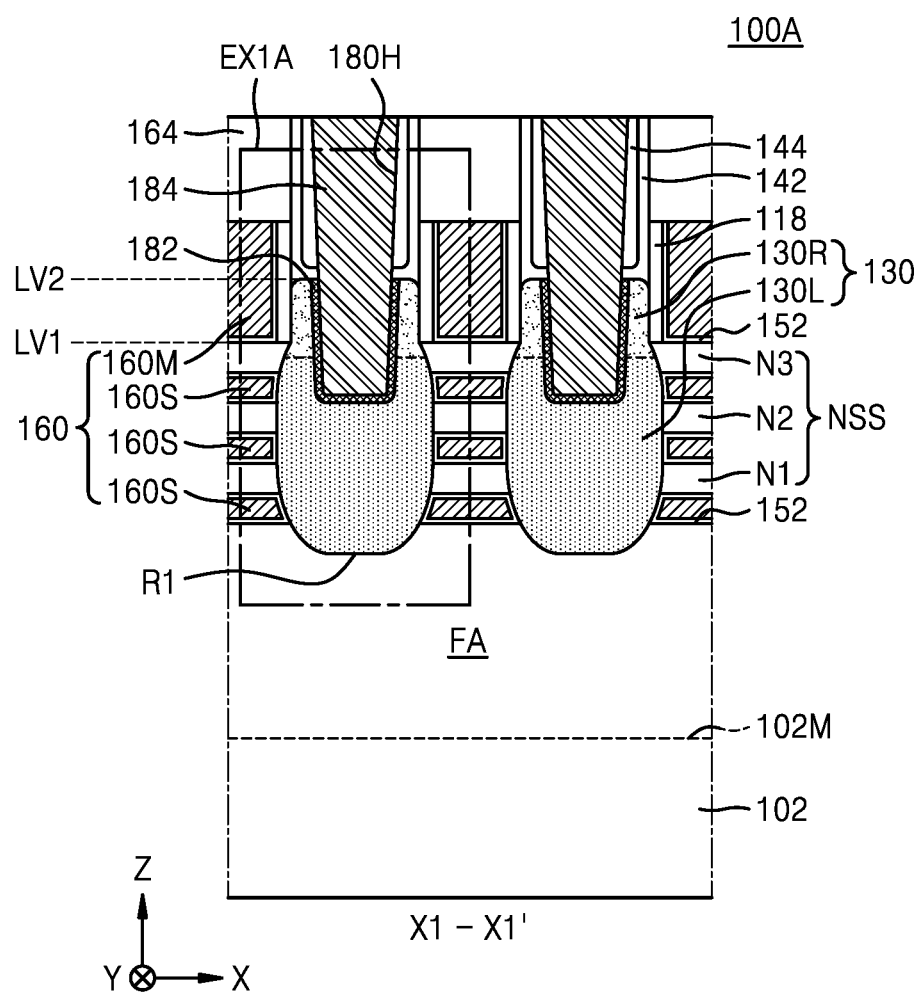
FIG. 3A is a cross-sectional view of an IC device according to embodiments.
Figure 3B:
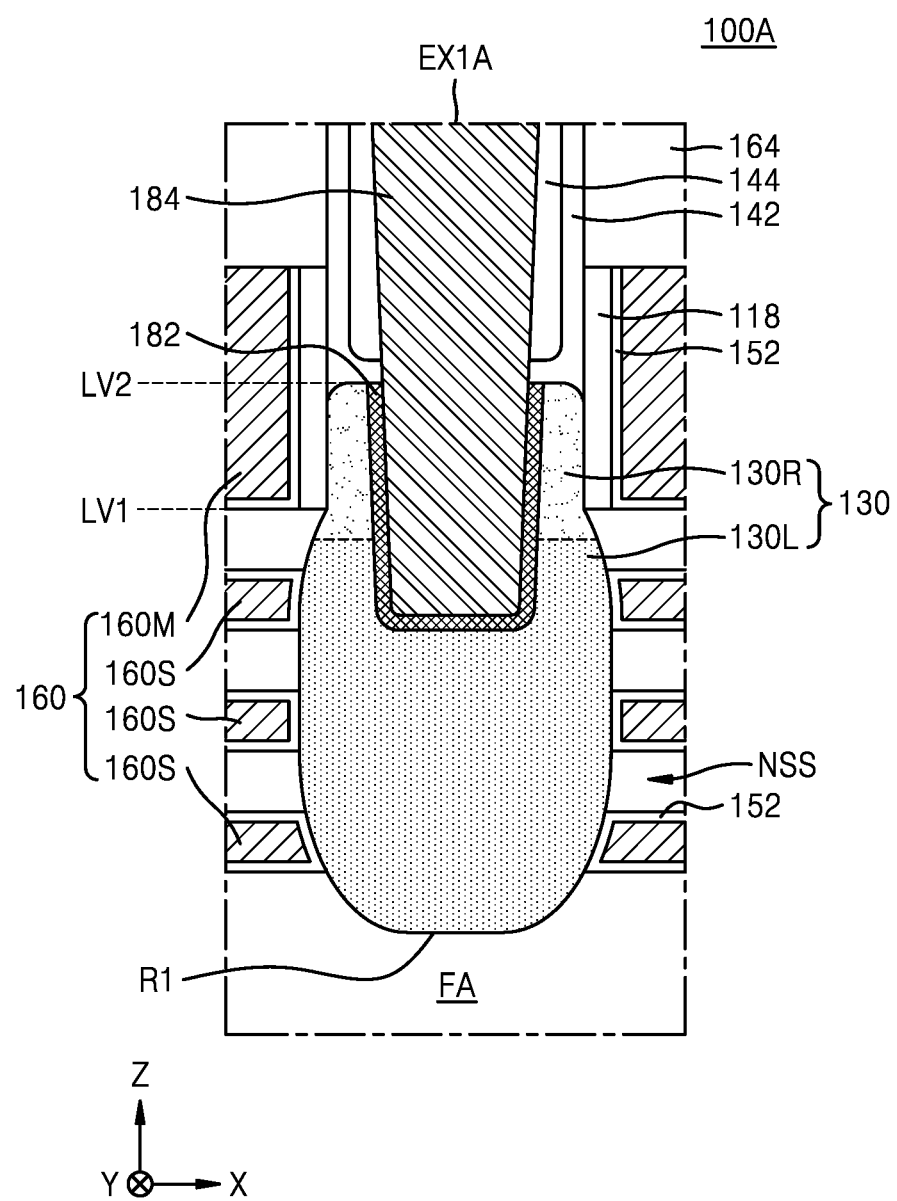
FIG. 3B is an enlarged cross-sectional view of a local region "EX1A" of FIG. 3A.

FIG. 3A is a cross-sectional view of an IC device 100A according to embodiments. FIG. 3B is an enlarged cross-sectional view of a local region "EX1A" of FIG. 3A. FIG. 3A illustrates some components in a portion corresponding to a cross-section taken along line X1-X1' of FIG. 1. In FIGS. 3A and 3B, the same reference numerals are used to denote the same elements as in FIGS. 1 and 2A to 2D, and detailed descriptions thereof are omitted.

Referring to FIGS. 3A and 3B, the IC device 100A may have substantially the same configuration as the IC device 100 described with reference to FIGS. 1 and 2A to 2D. However, the IC device 100A may further include a plurality of source/drain contacts 184 on a plurality of source/drain regions 130. Each of the plurality of source/drain contacts 184 may extend long in a vertical direction (Z direction) between a pair of gate lines 160, which are adjacent to each other, from among a plurality of gate lines 160. A metal silicide film 182 may be between the source/drain region 130 and the source/drain contact 184.

Each of the plurality of source/drain contacts 184 may fill a contact hole 180H, which passes through an inter-gate dielectric film 144 and an insulating liner 142 in the vertical direction (Z direction) and extends into the source/drain region 130. The source/drain region 130 may be apart from the source/drain contact 184 with the metal silicide film 182 therebetween. The source/drain region 130 may surround a lower portion of each of the plurality of source/drain contacts 184 outside the contact hole 180H.

In each of the plurality of source/drain regions 130, an upper source/drain region 130R may include a portion between an outer insulating spacer 118 and the source/drain contact 184. The upper source/drain region 130R may include a portion in contact with the outer insulating spacer 118 and a portion in contact with the metal silicide film 182. In each of the plurality of source/drain regions 130, each of a lower source/drain region 130L and the upper source/drain region 130R may include a portion in contact with the metal silicide film 182.

In each of the plurality of source/drain regions 130, the upper source/drain region 130R may include a portion between the source/drain contact 184 and at least one gate line 160 selected from a pair of gate lines 160, which are adjacent to each other, from among the plurality of gate lines 160.

In embodiments, the metal silicide film 182 may include titanium silicide, without being limited thereto. In embodiments, the metal silicide film 182 may be omitted. In this case, each of the lower source/drain region 130L and the upper source/drain region 130R of the source/drain region 130 may be in contact with the source/drain contact 184.

In embodiments, each of the plurality of source/drain contacts 184 may include a metal, a conductive metal nitride, or a combination thereof. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof.

Figure 4:
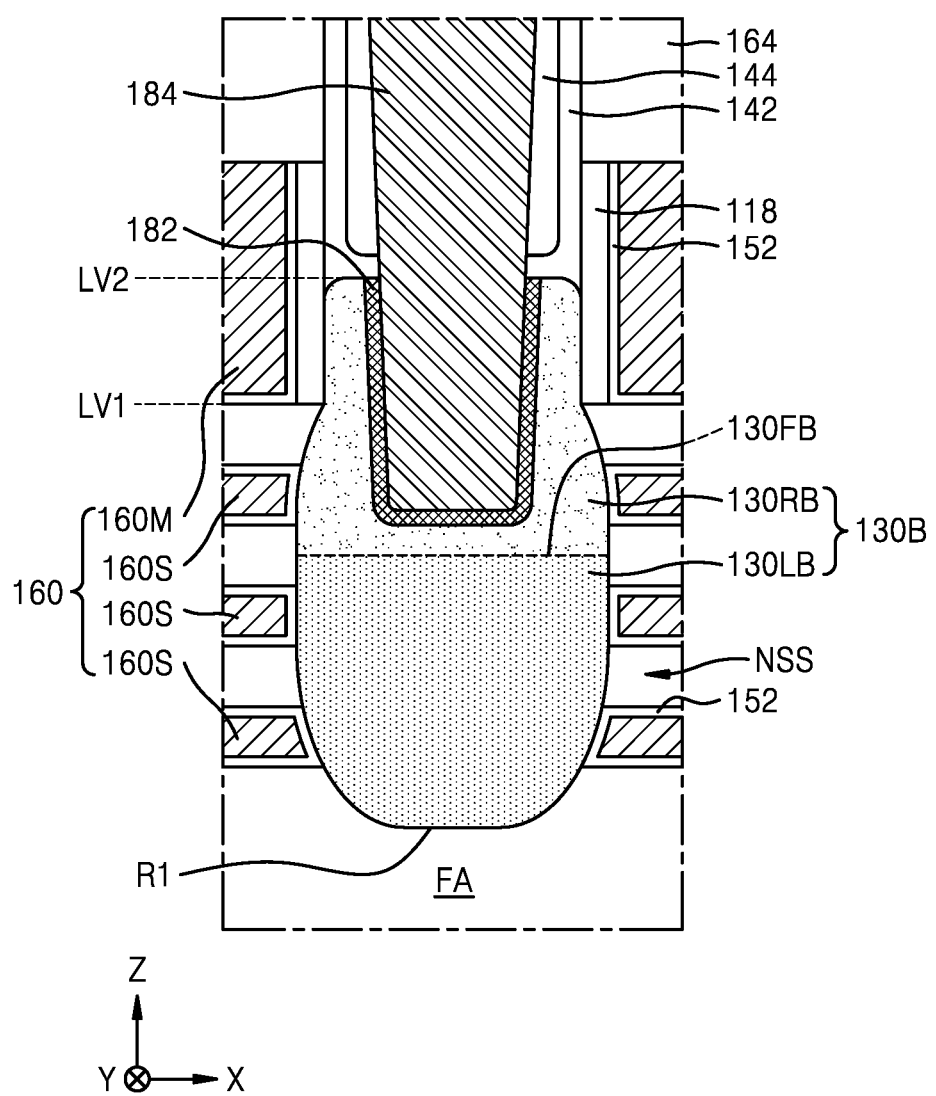
FIG. 4 is a cross-sectional view of an IC device according to embodiments.

FIG. 4 is a cross-sectional view of an IC device 100B according to embodiments. FIG. 4 illustrates an enlarged cross-sectional configuration of a region corresponding to the local region "EX1A" of FIG. 3A. In FIG. 4, the same reference numerals are used to denote the same elements as in FIGS. 1, 2A to 2D, 3A, and 3B, and detailed descriptions thereof are omitted.

Referring to FIG. 4, the IC device 100B may have substantially the same configuration as the IC device 100A described with reference to FIGS. 3A and 3B. However, the IC device 100B may include a source/drain region 130B instead of the source/drain region 130 shown in FIGS. 3A and 3B.

The source/drain region 130B may have substantially the same configuration as the source/drain region 130 described with reference to FIGS. 2A, 2C, 2D, 3A, and 3B. However, the source/drain region 130B may include a lower source/drain region 130LB and an upper source/drain region 130RB. The upper source/drain region 130RB may include a $^{28}$Si element at a content higher than a content of the $^{28}$Si element in the lower source/drain region 130LB. The upper source/drain region 130RB may have a top surface, which is at a vertical level LV2 that is higher than a vertical level LV1 of an uppermost surface of a nanosheet stack NSS including a channel region (i.e., an uppermost surface of the third nanosheet N3). A boundary 130FB between the lower source/drain region 130LB and the upper source/drain region 130RB may be at a vertical level lower than the vertical level LV1 of the uppermost surface of the nanosheet stack NSS including the channel region. For example, the boundary 130FB between the lower source/drain region 130LB and the upper source/drain region 130RB may be at a vertical level lower than a vertical level of an uppermost surface of the second nanosheet N2. The upper source/drain region 130RB may include a portion in contact with the second nanosheet N2, a portion in contact with the third nanosheet N3, and a portion in contact with the outer insulating spacer 118. The upper source/drain region 130RB may include a portion in a space between a pair of gate lines 160, which are adjacent to each other, from among a plurality of gate lines 160.

In the source/drain region 130B, the lower source/drain region 130LB may be apart from a metal silicide film 182 with the upper source/drain region 130RB therebetween. The metal silicide film 182 may be in contact with only the upper source/drain region 130RB, from among the lower source/drain region 130LB and the upper source/drain region 130RB. Detailed configurations of the lower source/drain region 130LB and the upper source/drain region 130RB may be substantially the same as those of the lower source/drain region 130L and the upper source/drain region 130R, which have been provided with reference to FIGS. 2A, 2C, and 2D.

Figure 5:
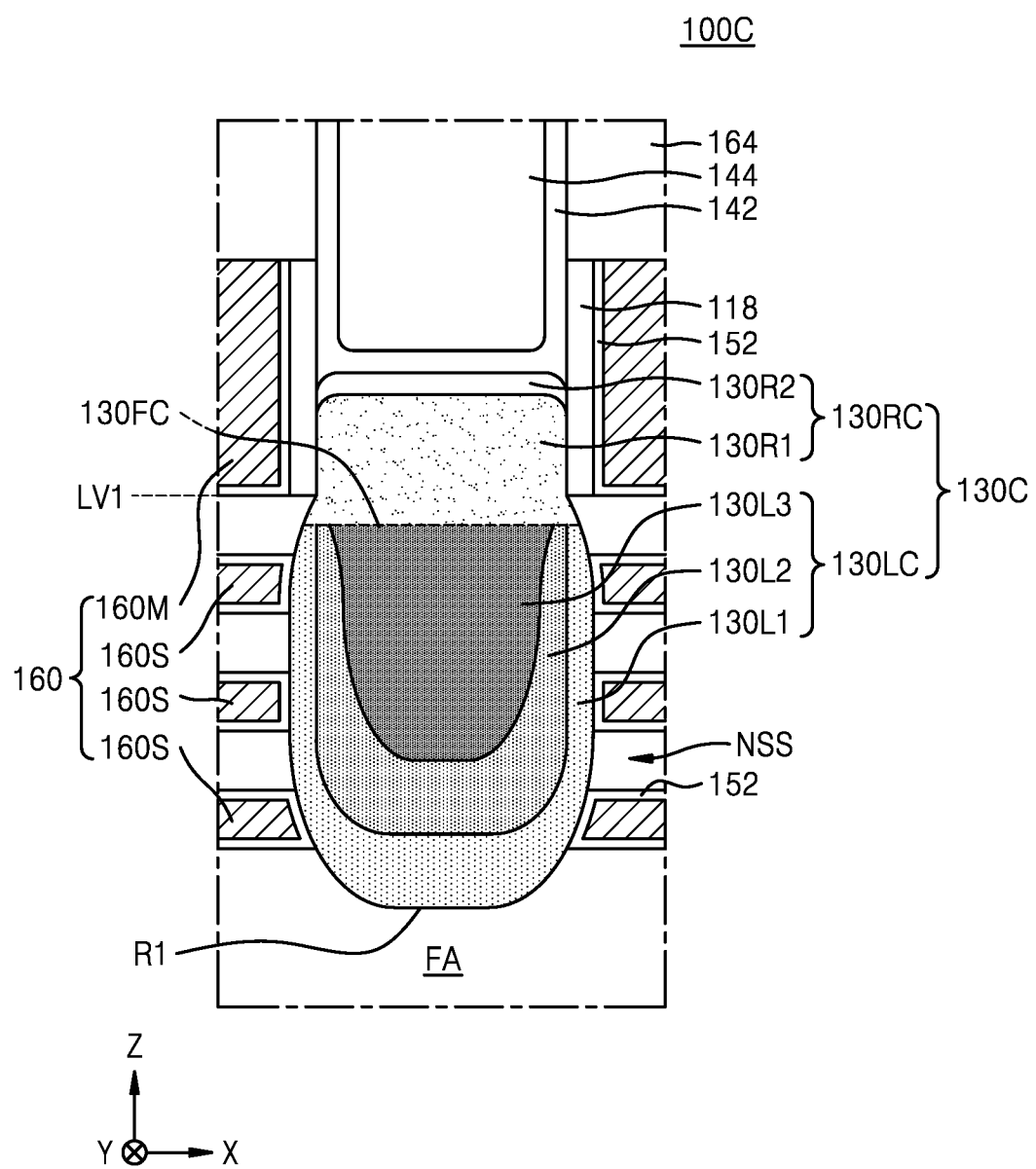
FIG. 5 is a cross-sectional view of an IC device according to embodiments.

FIG. 5 is a cross-sectional view of an IC device 100C according to embodiments. FIG. 5 illustrates an enlarged cross-sectional configuration of a region corresponding to the local region "EX1" of FIG. 2A. In FIG. 5, the same reference numerals are used to denote the same elements as in FIGS. 1 and 2A to 2D, and detailed descriptions thereof are omitted.

Referring to FIG. 5, the IC device 100C may have substantially the same configuration as the IC device 100 described with reference to FIGS. 1 and 2A to 2D. However, the IC device 100C may include a source/drain region 130C instead of the source/drain region 130 shown in FIGS. 2A, 2C, and 2D.

The source/drain region 130C may have substantially the same configuration as the source/drain region 130 described with reference to FIGS. 2A, 2C, and 2D. However, the source/drain region 130C may include a lower source/drain region 130LC and an upper source/drain region 130RC.

The lower source/drain region 130LC may include a first main body layer 130L1, a second main body layer 130L2, and a third main body layer 130L3, which are sequentially stacked on a fin-type active region FA. The first main body layer 130L1 may be in contact with the fin-type active region FA, which forms a bottom surface of a recess R1. The upper source/drain region 130RC may include an upper body layer 130R1 and an upper capping layer 130R2, which are sequentially stacked on the third main body layer 130L3.

The upper source/drain region 130RC may include a $^{28}$Si element at a content higher than a content of the $^{28}$Si element in the lower source/drain region 130LC. A boundary 130FC between the lower source/drain region 130LC and the upper source/drain region 130RC may be at a vertical level lower than a vertical level LV1 of an uppermost surface of a nanosheet stack NSS.

Of the upper source/drain region 130RC, the upper body layer 130R1 may include a portion in contact with the third nanosheet N3 and a portion in contact with the outer insulating spacer 118. The upper source/drain region 130RC may include a portion in a space between a pair of gate lines 160, which are adjacent to each other, from among a plurality of gate lines 160.

In embodiments, in the lower source/drain region 130LC of the source/drain region 130C, each of the first main body layer 130L1, the second main body layer 130L2, and the third main body layer 130L3 may include a $Si_{1-x}Ge_x$ layer (here, $0.15 \le x < 0.7$), which is doped with a p-type dopant. Here, a Ge concentration of the second main body layer 130L2 may be higher than a Ge concentration of the first main body layer 130L1, and a Ge concentration of the third main body layer 130L3 may be higher than the Ge concentration of the second main body layer 130L2. In embodiments, the Ge concentration of the first main body layer 130L1 may be selected in a range of about 15 at % to about 30 at %, the Ge concentration of the second main body layer 130L2 may be selected in a range of about 30 at % to about 50 at %, and the Ge concentration of the third main body layer 130L3 may be selected in a range of about 50 at % to about 70 at %, but the inventive concept is not limited thereto. In embodiments, the p-type dopant may be at least one selected from boron (B) and gallium (Ga), without being limited thereto.

In the upper source/drain region 130RC of the source/drain region 130C, the upper body layer 130R1 may include a semiconductor layer in which a $^{28}Si$ element is additionally doped into a constituent material of the third main body layer 130L3. In embodiments, the upper body layer 130R1 may include a SiGe film including at least about 50 at % of $^{28}Si$ element.

In the upper source/drain region 130RC of the source/drain region 130C, the upper capping layer 130R2 may cover a top surface of the upper body layer 130R1 at a vertical level, which is higher than the vertical level LV1 of the uppermost surface of the nanosheet stack NSS in a vertical direction (Z direction). In embodiments, the upper capping layer 130R2 may have a thickness of about 0.1 nm to about 10 nm. In embodiments, the upper capping layer 130R2 may include a silicon layer or a SiGe layer having a Ge concentration lower than a Ge concentration of the upper body layer 130R1. The silicon layer included in the upper capping layer 130R2 may include at least one silicon isotope including $^{28}Si$, from among silicon isotopes including $^{28}Si$, $^{29}Si$, and $^{30}Si$. A content of a $^{28}Si$ element in the upper capping layer 130R2 may be higher than a content of the $^{28}Si$ element in a silicon film existing in nature. In other embodiments, the upper capping layer 130R2 may include a silicon layer doped with a p-type dopant, which may be selected from boron (B) and gallium (Ga) but not limited thereto. For example, the upper capping layer 130R2 may include a silicon layer doped with boron (B). The silicon layer doped with the p-type dopant, which is in the upper capping layer 130R2, may include at least one silicon isotope including $^{28}Si$, from among silicon isotopes including $^{30}Si$, $^{29}Si$, and $^{30}Si$. A content of a $^{28}Si$ element in the silicon layer doped with the p-type dopant in the upper capping layer 130R2 may be higher than a content of the $^{28}Si$ element in a silicon film doped with a p-type dopant, which exists in nature. The upper capping layer 130R2 may protect the first main body layer 130L1, the second main body layer 130L2, the third main body layer 130L3, and the upper body layer 130R1. For example, the upper capping layer 130R2 may prevent chemicals or external shocks from being transmitted from the outside to the first main body layer 130L1, the second main body layer 130L2, the third main body layer 130L3, and the upper body layer 130R1.

Figure 6:
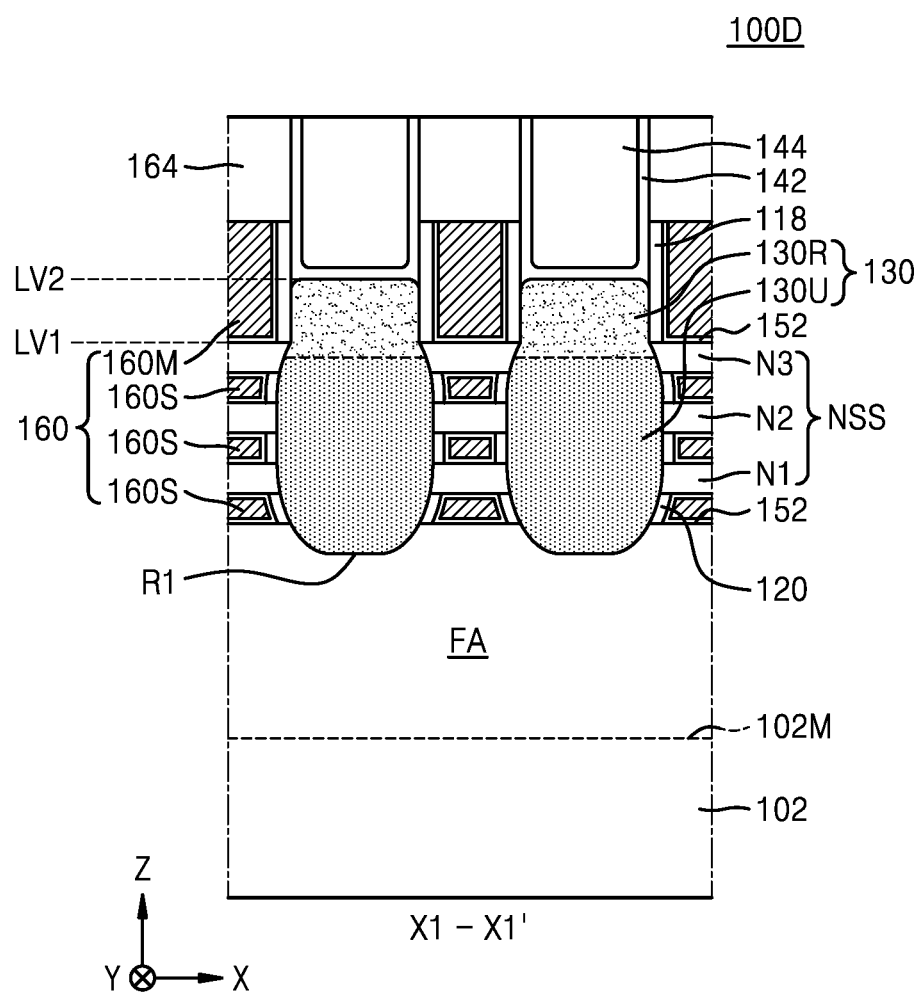
FIG. 6 is a cross-sectional view of an IC device according to embodiments.

FIG. 6 is a cross-sectional view of an IC device 100D according to embodiments. FIG. 6 illustrates some components in a portion corresponding to a cross-section taken along line X1-X1' of FIG. 1.

Referring to FIG. 6, the IC device 100D may have substantially the same configuration as the IC device 100 described with reference to FIGS. 1 and 2A to 2D. However, the IC device 100D may further include a plurality of inner insulating spacers 120, which are between first to third nanosheets N1, N2, and N3 and between the first nanosheet N1 and a fin-type active region FA and, also, between a plurality of sub-gate portions 160S and source/drain regions 130.

Both sidewalls of each of the plurality of sub-gate portions 160S may be covered by the inner insulating spacers 120 with a gate dielectric film 152 therebetween. Each of the plurality of sub-gate portions 160S may be apart from the source/drain region 130 with the gate dielectric film 152 and the inner insulating spacer 120 therebetween. Each of the plurality of inner insulating spacers 120 may be in contact with the source/drain region 130. At least some of the plurality of inner insulating spacers 120 may overlap an outer insulating spacer 118 in a vertical direction (Z direction).

The plurality of inner insulating spacers 120 may include silicon nitride, silicon oxide, SiCN, SiBN, SiON, SiOCN, SiBCN, SiOC, or a combination thereof. In embodiments, each of at least some of the plurality of inner insulating spacers 120 may further include an air gap. In embodiments, the inner insulating spacer 120 may include the same material as the outer insulating spacer 118. In other embodiments, the outer insulating spacer 118 and the inner insulating spacer 120 may include different materials from each other.

Each of a plurality of source/drain regions 130 may face the plurality of sub-gate portions 160S with the inner insulating spacer 120 and the gate dielectric film 152 therebetween in a first lateral direction (X direction). Each of the plurality of source/drain regions 130 may not include a portion in contact with the gate dielectric film 152.

Figure 7:
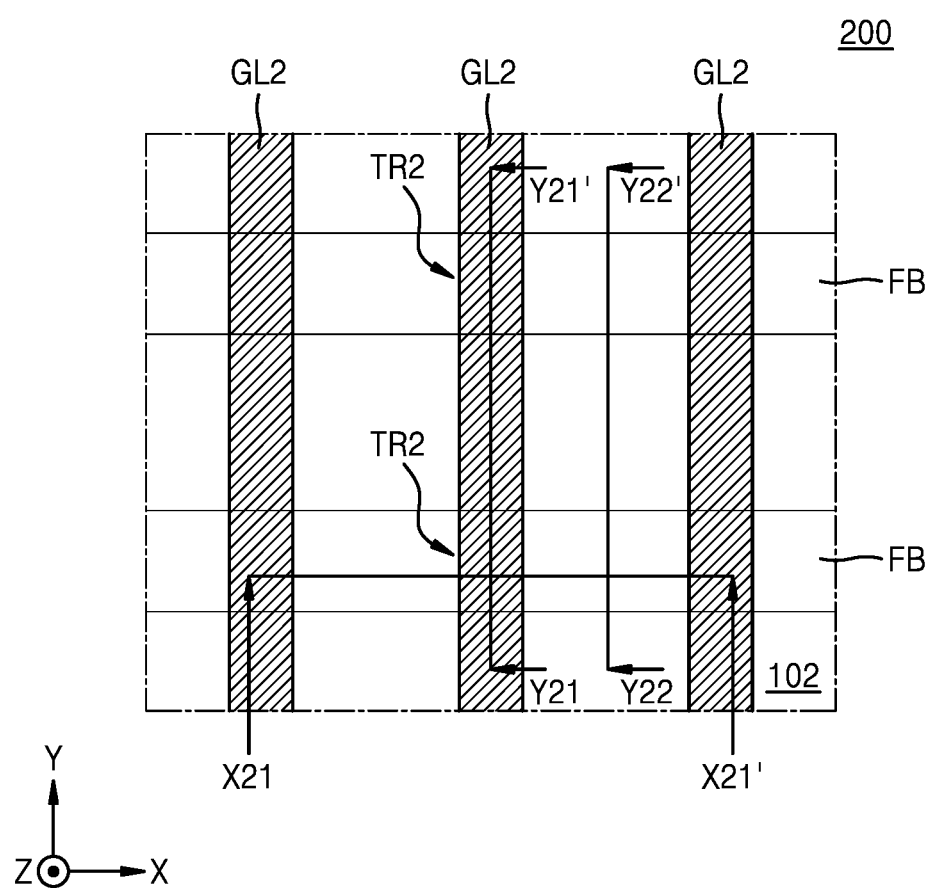
FIG. 7 is a plan layout diagram of an IC device according to embodiments.
Figure 8A:
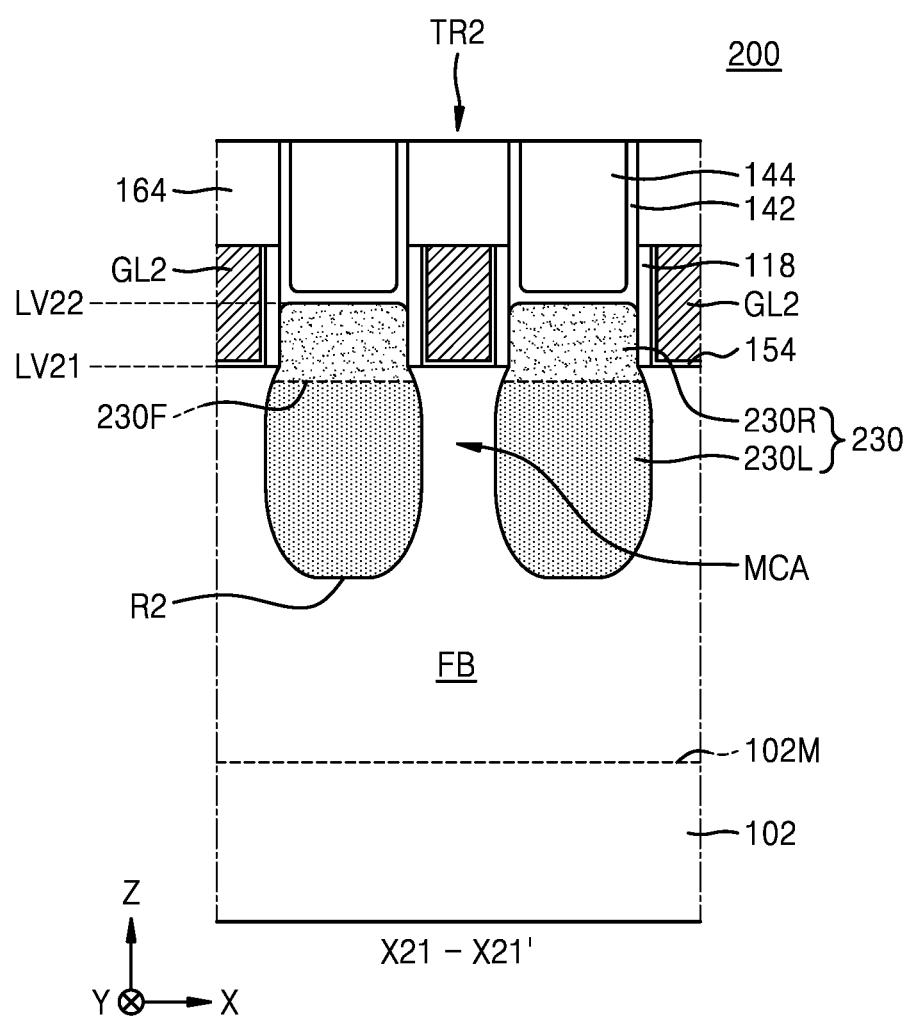
FIG. 8A is a cross-sectional view taken along line X21-X21' of FIG. 7.
Figure 8B:
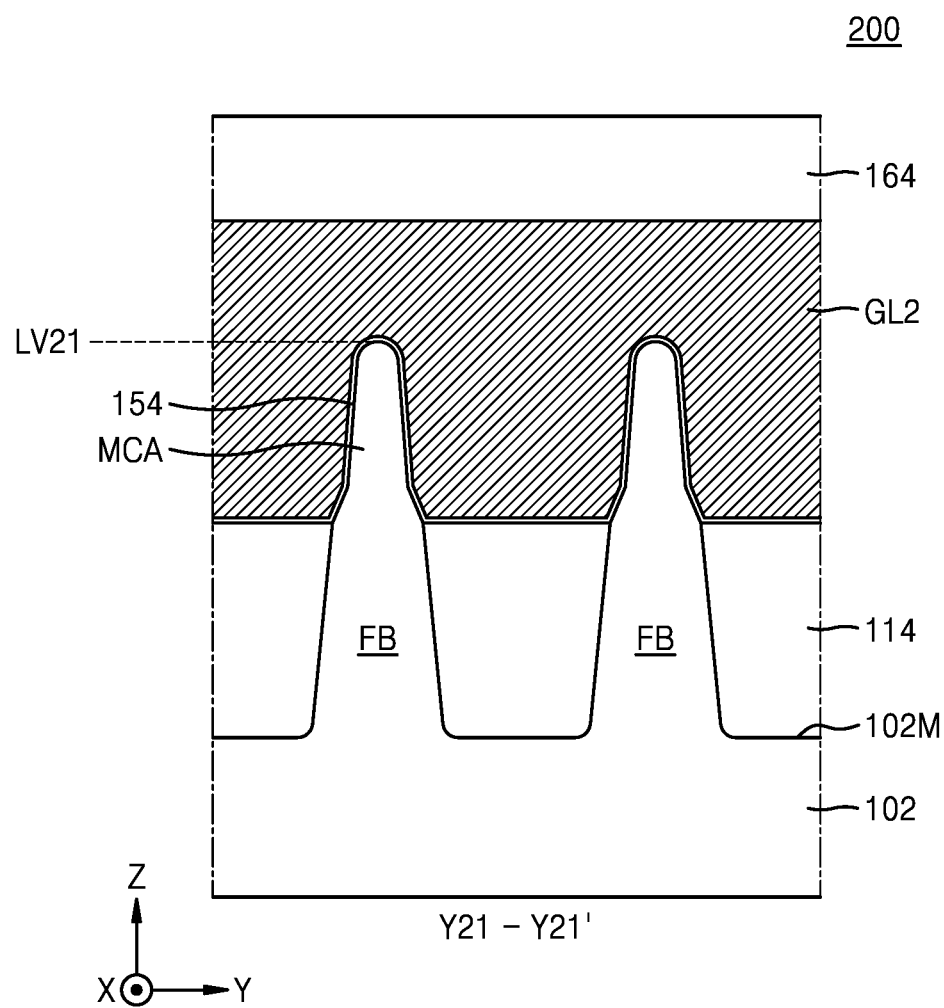
FIG. 8B is a cross-sectional view taken along line Y21-Y21' of FIG. 7.
Figure 8C:
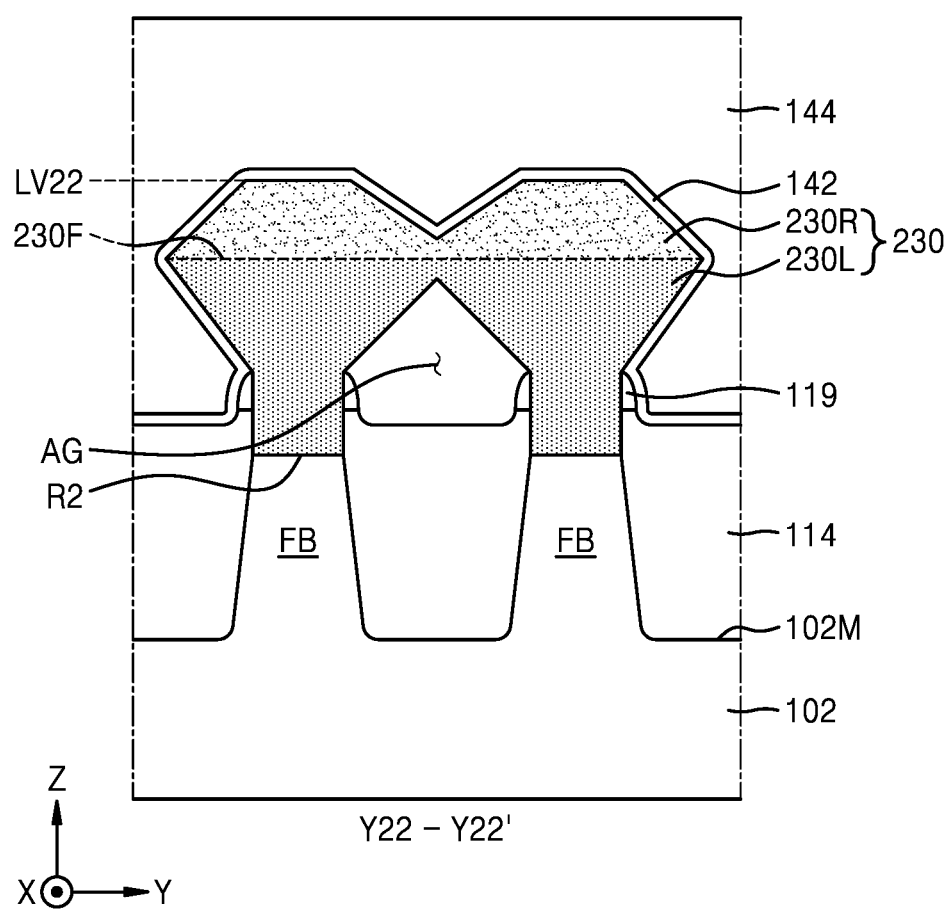
FIG. 8C is a cross-sectional view taken along line Y22-Y22' of FIG. 7.

FIG. 7 is a plan layout diagram of some components of an IC device 200 according to embodiments. FIG. 8A is a cross-sectional view taken along line X21-X21' of FIG. 7. FIG. 8B is a cross-sectional view taken along line Y21-Y21' of FIG. 7. FIG. 8C is a cross-sectional view taken along line Y22-Y22' of FIG. 7. In FIGS. 7 and 8A to 8C, the same reference numerals are used to denote the same elements as in FIGS. 1 and 2A to 2D, and detailed descriptions thereof are omitted.

The IC device 200 may include a plurality of FETs TR2 formed on a fin-type active region FB. The plurality of FETs TR2 may constitute a logic circuit or a memory device.

The IC device 200 may include a plurality of fin-type active regions FB and a plurality of main channel regions MCA. The plurality of fin-type active regions FB may protrude from a substrate 102 in a vertical direction (Z direction) and extend long in a first lateral direction (X direction). The plurality of main channel regions MCA may protrude upward in the vertical direction (Z direction) from the plurality of fin-type active regions FB, respectively, and be integral (e.g., integrally connected) to the fin-type active regions FB, respectively.

As shown in FIGS. 8B and 8C, a device isolation film 114 covering both sidewalls of each of the plurality of fin-type active regions FB may be on a substrate 102. As shown in FIGS. 7, 8A, and 8B, a plurality of gate lines GL2 may be on the fin-type active region FB. Each of the plurality of gate lines GL2 may extend long in a second lateral direction (Y direction). As shown in FIG. 8B, a portion of each of the plurality of main channel regions MCA may be surrounded by the gate line GL2. A constituent material of the plurality of gate lines GL2 may be substantially the same as that of the gate line 160, which has been described with reference to FIGS. 1, 2A, and 2B. A plurality of FETs TR2 may be formed in regions where the plurality of fin-type active regions FB intersect with the plurality of gate lines GL2.

In embodiments, the fin-type active region FB and the main channel region MCA may include the same material as each other. For example, each of the fin-type active region FB and the main channel region MCA may include a silicon (Si) layer. In embodiments, the main channel region MCA may include an undoped Si layer, a silicon layer doped with a p-type dopant, or a silicon layer doped with an n-type dopant.

As shown in FIG. 8A, a plurality of recesses R2 may be formed in the fin-type active region FB. In the first lateral direction (X direction), a width of the main channel region MCA may be defined by two adjacent ones of the plurality of recesses R2. A plurality of source/drain regions 230 may be in the plurality of recesses R2. The main channel region MCA may have surfaces in contact with a pair of source/drain regions 230 adjacent to both sides thereof.

Each of the plurality of source/drain regions 230 may be adjacent to at least one gate line GL2 selected from the plurality of gate lines GL2. Each of the plurality of source/drain regions 230 may include a lower source/drain region 230L in contact with the fin-type active region FB and an upper source/drain region 230R, which is on the lower source/drain region 230L. The upper source/drain region 230R may be integral (e.g., integrally connected) to the lower source/drain region 230L. Detailed configurations of the lower source/drain region 230L and the upper source/drain region 230R of the source/drain region 230 may be substantially the same as those of the lower source/drain region 130L and the upper source/drain region 130R of the source/drain region 130, which have been provided with reference to FIGS. 2A, 2C, and 2D. However, each of the lower source/drain region 230L and the upper source/drain region 230R may include a portion in contact with the main channel region MCA.

In each of the plurality of source/drain regions 230, the lower source/drain region 230L may be in contact with the fin-type active region FB, which forms an inner wall of the recess R2. In each of the plurality of source/drain regions 230, the upper source/drain region 230R may have a top surface, which is at a vertical level LV22 higher than a vertical level LV21 of an uppermost surface of the main channel region MCA. A boundary 230F between the lower source/drain region 230L and the upper source/drain region 230R may be at a vertical level lower than the vertical level LV21 of the uppermost surface of the main channel region MCA. Detailed configurations of the lower source/drain region 230L and the upper source/drain region 230R included in the source/drain region 230 may be substantially the same as those of the lower source/drain region 130L and the upper source/drain region 130R, which have been described with reference to FIGS. 2A, 2C, and 2D.

A gate dielectric film 154 may be between the main channel region MCA and the gate line GL2. The gate dielectric film 154 may cover a bottom surface and sidewalls of the gate line GL2. The gate dielectric film 154 may have a surface in contact with the main channel region MCA. A detailed configuration of the gate dielectric film 154 may be substantially the same as that of the gate dielectric film 152, which has been provided with reference to FIGS. 2A and 2B.

Both sidewalls of each of the plurality of gate lines GL2 may be covered by outer insulating spacers 118. The outer insulating spacers 118 may cover both sidewalls of the gate line GL2 on a top surface of the main channel region MCA. Each of the outer insulating spacers 118 may be apart from the gate line GL2 with the gate dielectric film 154 therebetween.

Each of the plurality of source/drain regions 230 may include a portion, which overlaps the outer insulating spacer 118 in the vertical direction (Z direction). For example, a portion of each of the plurality of source/drain regions 230, which overlaps the outer insulating spacer 118 in the vertical direction (Z direction), may have a width selected in a range from about 0 nm to about 4 nm in the first lateral direction (X direction), without being limited thereto. Each of the plurality of source/drain regions 230 and a plurality of outer insulating spacers 118 may be covered by an insulating liner 142. An inter-gate dielectric film 144 may be on the insulating liner 142.

As shown in FIG. 8C, a plurality of recess-side insulating spacers 119 covering sidewalls of the lower source/drain region 230L included in the source/drain region 230 may be on the top surface of the device isolation film 114. In embodiments, each of the plurality of recess-side insulating spacers 119 may be integral (e.g., integrally connected) to the outer insulating spacer 118 adjacent thereto. An air gap AG may be in a space defined by the recess-side insulating spacer 119 and the source/drain region 230 and the device isolation film 114, which are adjacent thereto.

Figure 9:
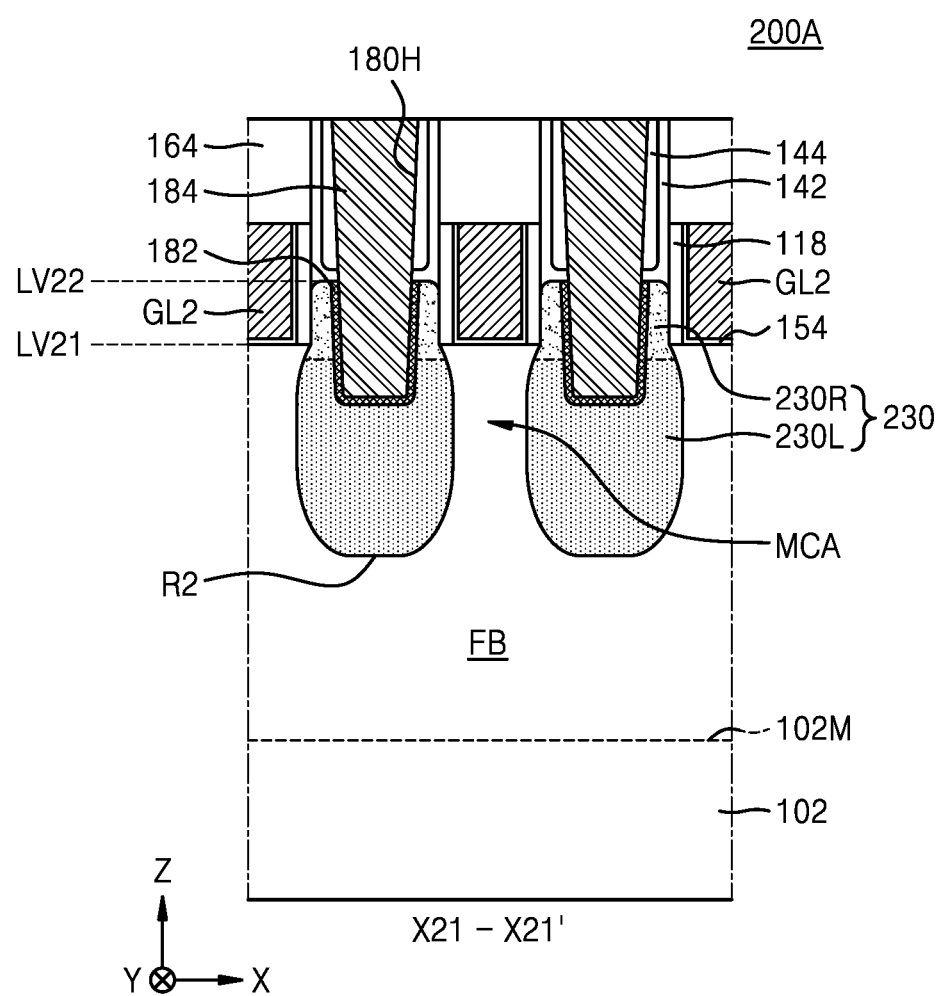
FIG. 9 is a cross-sectional view of an IC device according to embodiments.

FIG. 9 is a cross-sectional view of an IC device 200A according to embodiments. FIG. 9 illustrates some components in a portion corresponding to a cross-section taken along line X21-X21' of FIG. 7. In FIG. 9, the same reference numerals are used to denote the same elements as in FIGS. 3A, 3B, 7, and 8A to 8C, and detailed descriptions thereof are omitted.

Referring to FIG. 9, the IC device 200A may have substantially the same configuration as the IC device 200 described with reference to FIGS. 7 and 8A to 8C. However, the IC device 200A may further include a plurality of source/drain contacts 184 on a plurality of source/drain regions 230. Each of the plurality of source/drain contacts 184 may extend long in a vertical direction (Z direction) between a pair of gate lines GL2, which are adjacent to each other, from among the plurality of gate lines GL2.

A metal silicide film 182 may be between the source/drain region 230 and the source/drain contact 184. Each of the plurality of source/drain contacts 184 may fill a contact hole 180H, which passes through an inter-gate dielectric film 144 and an insulating liner 142 in the vertical direction (Z direction) and extends into the source/drain region 230. The source/drain region 230 may be apart from the source/drain contact 184 with the metal silicide film 182 therebetween. The source/drain region 230 may surround a lower portion of each of the plurality of the source/drain contacts 184 outside the contact hole 180H.

In each of the plurality of source/drain regions 230, an upper source/drain region 230R may include a portion between an outer insulating spacer 118 and the source/drain contact 184. The upper source/drain region 230R may include a portion in contact with the outer insulating spacer 118 and a portion in contact with the metal silicide film 182. In each of the plurality of source/drain regions 230, each of a lower source/drain region 230L and the upper source/drain region 230R may include a portion in contact with the metal silicide film 182.

In each of the plurality of source/drain regions 230, the upper source/drain region 230R may include a portion between the source/drain contact 184 and at least one gate line GL2 selected from a pair of gate lines GL2, which are adjacent to each other, from among the plurality of gate lines GL2.

Figure 10:
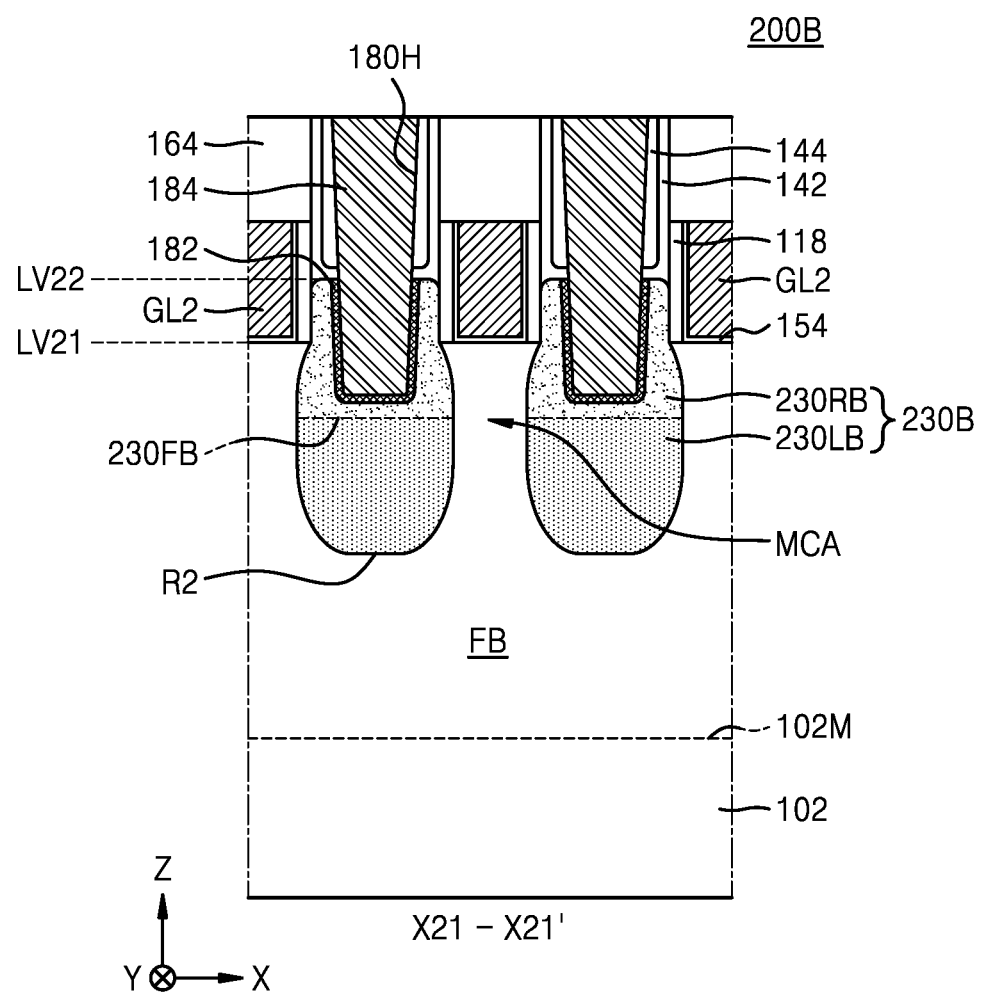
FIG. 10 is a cross-sectional view of an IC device according to embodiments.

FIG. 10 is a cross-sectional view of an IC device 200B according to embodiments. FIG. 10 illustrates some components in a portion corresponding to a cross-section taken along line X21-X21' of FIG. 7. In FIG. 10, the same reference numerals are used to denote the same elements as in FIGS. 3A, 3B, 7, and 8A to 8C, and detailed descriptions thereof are omitted.

Referring to FIG. 10, the IC device 200B may have substantially the same configuration as the IC device 200A described with reference to FIG. 9. However, the IC device 200B may include a source/drain region 230B instead of the source/drain region 230 shown in FIG. 9.

The source/drain region 230B may have substantially the same configuration as the source/drain region 230 described with reference to FIGS. 8A, 8C, and 9. However, the source/drain region 230B may include a lower source/drain region 230LB and an upper source/drain region 230RB.

The upper source/drain region 230RB may include a $^{28}$Si element at a content higher than a content of the $^{28}$Si element in the lower source/drain region 230LB. The upper source/drain region 230RB may have a top surface, which is at a vertical level LV22 higher than a vertical level LV21 of an uppermost surface of the main channel region MCA. A boundary 230FB between the lower source/drain region 230LB and the upper source/drain region 230RB may be at a vertical level lower than the vertical level LV21 of the uppermost surface of the main channel region MCA. Each of the lower source/drain region 230LB and the upper source/drain region 230RB may include a portion in contact with the main channel region MCA. The upper source/drain region 230RB may include a portion in contact with an outer insulating spacer 118. The upper source/drain region 230RB may include a portion in a space between a pair of gate lines GL2, which are adjacent to each other, from among a plurality of gate lines GL2.

In the source/drain region 230B, the lower source/drain region 230LB may be apart from a metal silicide film 182 with the upper source/drain region 230RB therebetween. The metal silicide film 182 may be in contact with only the upper source/drain region 230RB, from among the lower source/drain region 230LB and the upper source/drain region 230RB. Detailed compositions of constituent materials of the lower source/drain region 230LB and the upper source/drain region 230RB are respectively the same as those of the lower source/drain region 130L and the upper source/drain region 130R, which have been described with reference to FIGS. 2A, 2C, and 2D.

Figure 11:
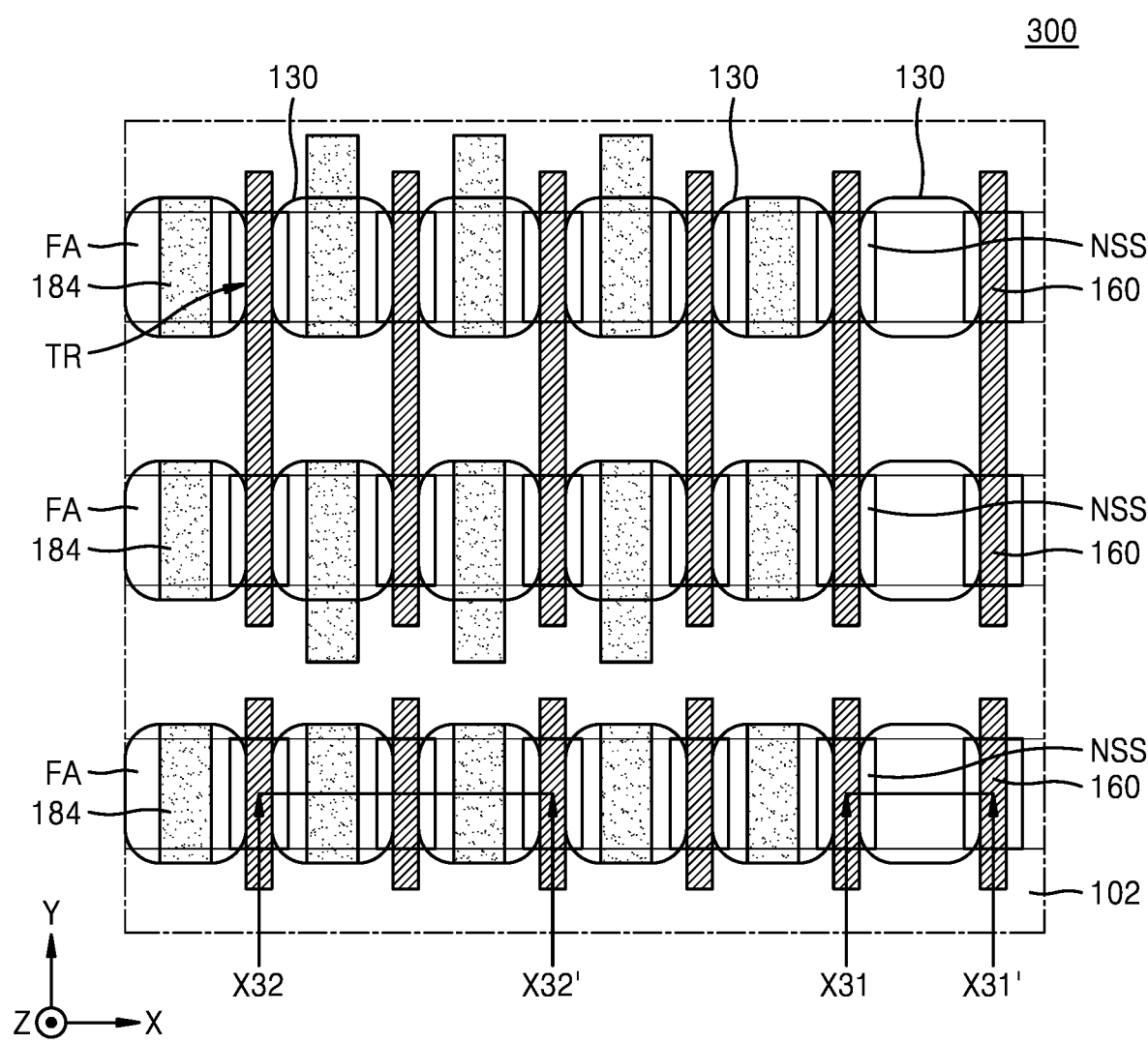
FIG. 11 is a plan layout diagram of an IC device according to embodiments.

FIG. 11 is a plan layout diagram of an IC device 300 according to embodiments. In FIG. 11, the same reference numerals are used to denote the same elements as in FIGS. 1, 2A to 2D, 3A, and 3B, and detailed descriptions thereof are omitted.

Referring to FIG. 11, the IC device 300 may include a plurality of fin-type active regions FA and a plurality of gate lines 160. The plurality of fin-type active regions FA may protrude from a substrate 102 in a vertical direction (Z direction) and extend long in a first lateral direction (X direction). The plurality of gate lines 160 may extend long in a second lateral direction (Y direction) on the plurality of fin-type active regions FA. A plurality of nanosheet stacks NSS may be respectively on fin top surfaces of the plurality of fin-type active regions FA in regions where the plurality of fin-type active regions FA intersect with the plurality of gate lines 160. On the substrate 102, a plurality of FETs TR may be formed in portions where the plurality of fin-type active regions FA intersect with the plurality of gate lines 160.

A plurality of source/drain regions 130 may be adjacent to the gate lines 160 on the plurality of fin-type active regions FA, and source/drain contacts 184 may be on some of the plurality of source/drain regions 130 and connected to the source/drain regions 130. The source/drain contacts 184 may not be in some other ones of the plurality of source/drain regions 130.

In embodiments, a cross-sectional configuration taken along line X31-X31' of FIG. 11 may be substantially the same as any one of the cross-sectional configurations described with reference to FIGS. 2A, 2D, 5, and 6. In embodiments, a cross-sectional configuration taken along line X32-X32' of FIG. 11 may be substantially the same as any one of the cross-sectional configurations described with reference to FIGS. 3A, 3B, and 4.

Figure 12:
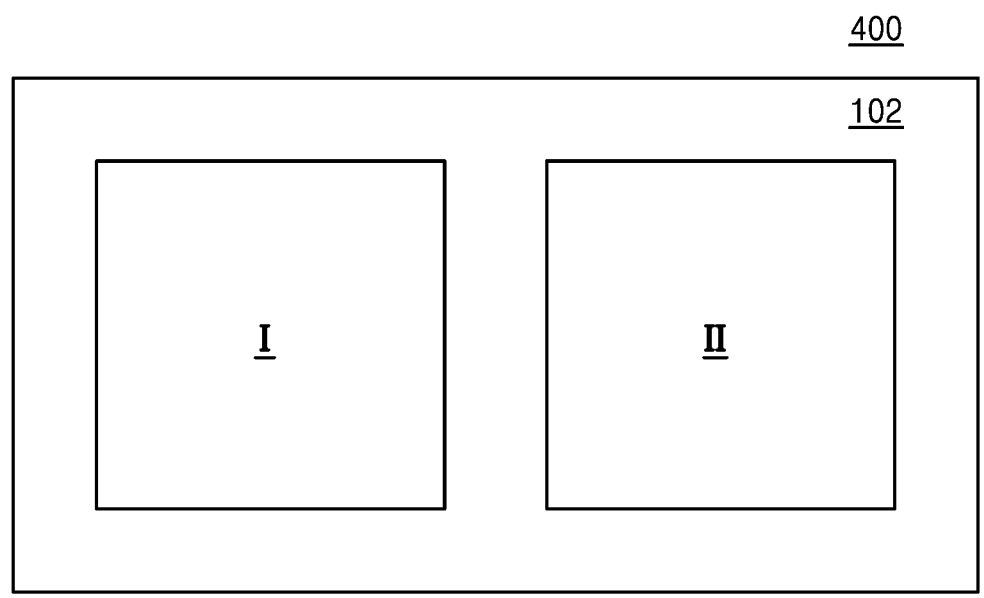
FIG. 12 is a block diagram of an IC device according to embodiments.

FIG. 12 is a block diagram of an IC device 400 according to embodiments.

Referring to FIG. 12, the IC device 400 may include a substrate 102 having a first region I and a second region II. The first region I and the second region II of the substrate 102 may refer to different regions of the substrate 102 and may be regions configured to perform different operations on the substrate 102. The first region I and the second region II may be apart from each other in a lateral direction.

In embodiments, the first region I may be a region in which devices configured to operate in a low-power mode are formed, while the second region II may be a region in which devices configured to operate in a high-power mode are formed. In other embodiments, the first region I may be a region in which a memory device or a non-memory device is formed, while the second region II may be a region in which a peripheral circuit (e.g., an input/output (I/O) device) is formed.

In embodiments, the first region I may constitute a volatile memory device, such as dynamic random access memory (DRAM) and static RAM (SRAM), or a non-volatile memory device, such as read-only memory (ROM), mask ROM (MROM), programmable ROM (PROM), erasable programmable ROM (EPROM), electrically erasable programmable ROM (EEPROM), ferromagnetic ROM (FROM), phase-change RAM (PRAM), magnetic RAM (MRAM), resistive RAM (RRAM), and flash memory. In other embodiments, the first region I may be a region in which a non-memory device (e.g., a logic device) is formed. The logic device may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch. However, the structures and configurations of the first region I and the second region II are not limited to the examples described above.

In the IC device 400, a pattern density of the second region II may be lower than a pattern density of the first region I. In embodiments, the first region I may include at least one selected from the structures of the IC devices 100, 100A, 100B, 100C, 100D, 200, 200A, 200B, and 300, which have been described with reference to FIGS. 1 to 11.

Figure 13:
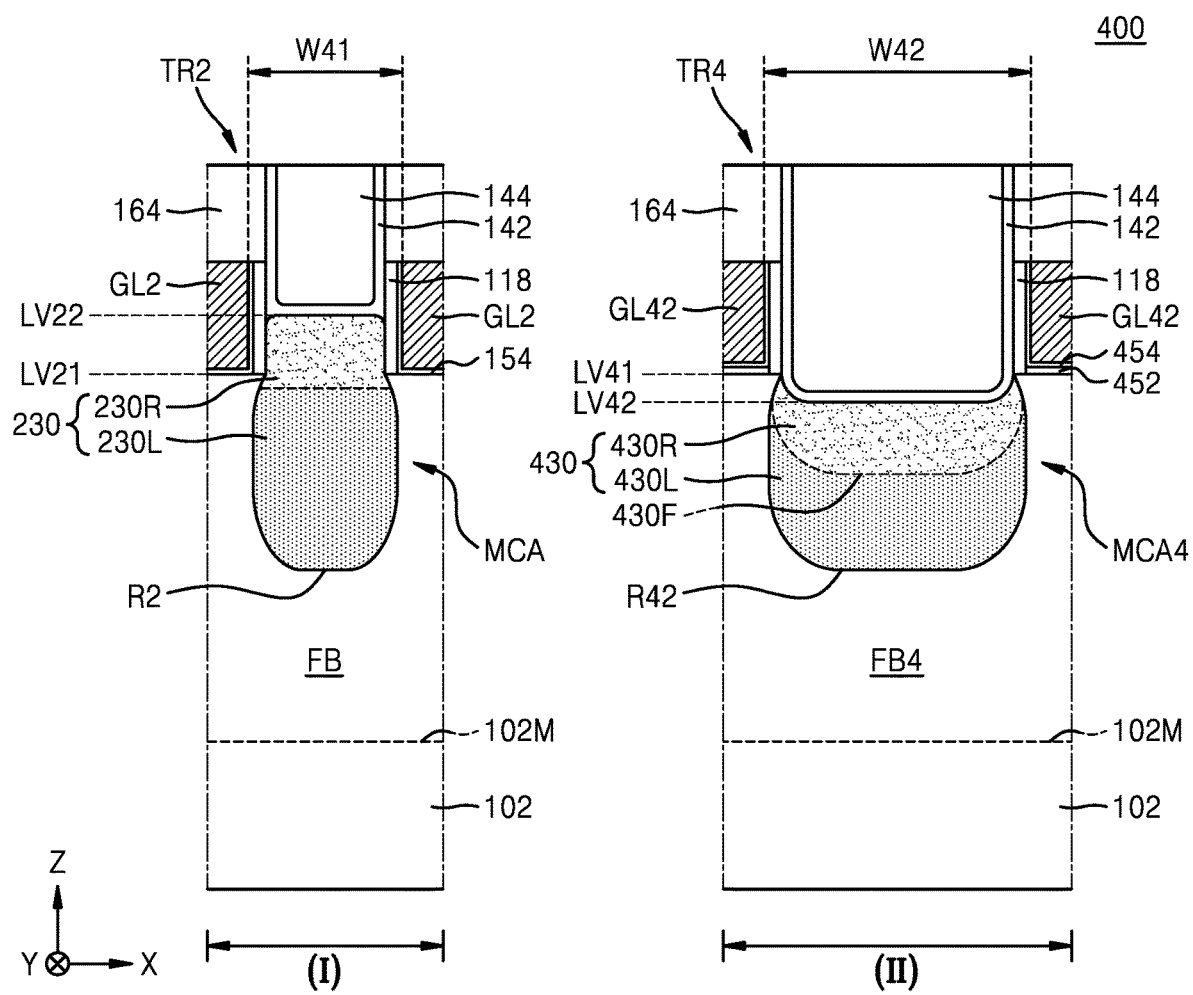
FIG. 13 shows cross-sectional views of example configurations of the IC device shown in FIG. 12.

FIG. 13 shows cross-sectional views of example configurations of the IC device 400 shown in FIG. 12.

Referring to FIG. 13, in the IC device 400, a first region I may include a structure having the same configuration as that described with reference to FIG. 8A. A second region II may include a structure having a configuration similar to that described with reference to FIG. 8A. However, in the first region I, a pair of gate lines GL2 may be apart from each other with a source/drain region 230 therebetween. The pair of gate lines GL2 may be a first distance W41 apart from each other in a lengthwise direction (or the first lateral direction (X direction) of FIG. 13) of a fin-type active region FB. In addition, in the second region II, a source/drain region 430 may be in a recess R42, which is formed in an upper portion of a fin-type active region FB4. A pair of gate lines GL42 may be on the fin-type active region FB4 and be apart from each other with the source/drain region 430 therebetween. In the second region II, the pair of gate lines GL42 may be a second distance W42 apart from each other in the lengthwise direction (or the first lateral direction (X direction) of FIG. 13) of the fin-type active region FB4. Here, the second distance W42 may be greater than the first distance W41. As used herein, the fin-type active region FB in the first region I may be referred to as a first fin-type active region, and the fin-type active region FB4 in the second region II may be referred to as a second fin-type active region. As used herein, the gate line GL2 in the first region I may referred to as a first gate line, and the second gate line GL42 in the second region II may be referred to as a second gate line. As used herein, the source/drain region 230 in the first region I may be referred to as a first source/drain region, and the source/drain region 430 in the second region II may be referred to as a second source/drain region. Detailed configurations of the fin-type active region FB4 and gate line GL42 may be substantially the same as those of the fin-type active region FA and the gate line 160, which have been provided with reference to FIGS. 1 and 2A to 2D.

In the second region II, the source/drain region 430 may be between a pair of gate lines GL42. The source/drain region 430 may include a lower source/drain region 430L and an upper source/drain region 430R. The lower source/drain region 430L may be in contact with the fin-type active region FB4, which forms an inner wall of the recess R42. The upper source/drain region 430R may be on the lower source/drain region 430L and integral (e.g., integrally connected) to the lower source/drain region 430L. The upper source/drain region 430R may include a $^{28}$Si element at a content higher than a content of the $^{28}$Si element in the lower source/drain region 430L. Each of the lower source/drain region 430L and the upper source/drain region 430R may be in contact with a main channel region MCA4.

In the source/drain region 430, the upper source/drain region 430R may have a top surface, which is at a vertical level LV42 lower than a vertical level LV41 of an uppermost surface of the main channel region MCA4. A boundary 430F between the lower source/drain region 430L and the upper source/drain region 430R may be at a vertical level lower than the vertical level LV41 of the uppermost surface of the main channel region MCA4. The upper source/drain region 430R may not include a portion in a space between a pair of gate lines GL42. Detailed compositions of constituent materials of the lower source/drain region 430L and the upper source/drain region 430R of the source/drain region 430 are respectively and substantially the same as those of the lower source/drain region 130L and the upper source/drain region 130R, which have been described with reference to FIGS. 2A, 2C, and 2D.

An interface dielectric film 452 and a gate dielectric film 454 may be between the main channel region MCA4 and the gate line GL42. In embodiments, the interface dielectric film 452 may include a low-k dielectric film such as a silicon oxide film, without being limited thereto, and the gate dielectric film 454 may include a high-k dielectric film having a higher dielectric constant than a silicon oxide film. A detailed configuration of the gate dielectric film 454 may be substantially the same as that of the gate dielectric film 152, which has been provided with reference to FIGS. 2A, 2B, and 2D. A plurality of FETs TR4 may be formed in portions where the fin-type active regions FB4 intersect with the gate lines GL42.

Both sidewalls of each of the pair of gate lines GL42 may be covered by outer insulating spacers 118. The outer insulating spacers 118 may cover both sidewalls of the gate line GL42 on a top surface of the main channel region MCA4. The source/drain region 430 may include a portion, which overlaps the outer insulating spacer 118 in a vertical direction (Z direction). Each of the source/drain region 430 and a plurality of outer insulating spacers 118 may be covered by an insulating liner 142. An inter-gate dielectric film 144 may be on the insulating liner 142.

Figure 14:
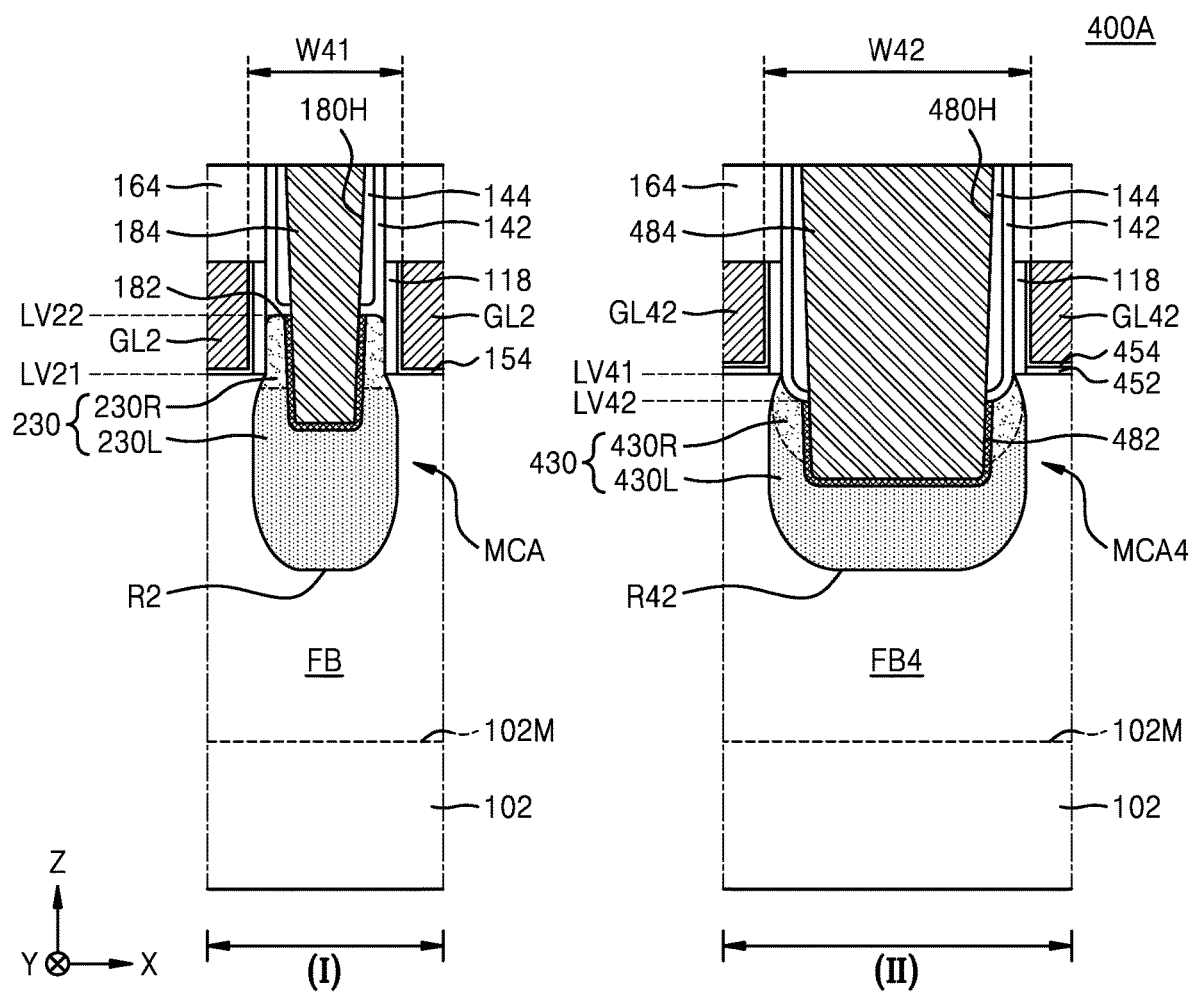
FIG. 14 shows cross-sectional views of an IC device according to embodiments.

FIG. 14 shows cross-sectional views of example configurations of an IC device 400A, which is a modified example of the IC device 400 shown in FIG. 13.

Referring to FIG. 14, the IC device 400A may have substantially the same configuration as the IC device 400 described with reference to FIGS. 12 and 13. However, in the IC device 400A, a first region I may include a structure having the same configuration as that described with reference to FIG. 9. A second region II may include a structure having a configuration similar to the structure of the second region II, which has been described with reference to FIG. 13. However, the IC device 400A may further include a source/drain contact 484 on a source/drain region 430 in the second region II. The source/drain contact 484 may extend long in a vertical direction (Z direction) between a pair of gate lines GL42, which are adjacent to each other.

A metal silicide film 482 may be between the source/drain region 430 and the source/drain contact 484. The source/drain contact 484 may be in a contact hole 480H, which passes through an inter-gate dielectric film 144 and an insulating liner 142 in the vertical direction (Z direction) and extends into the source/drain region 430. The source/drain region 430 may be apart from the source/drain contact 484 with the metal silicide film 482 therebetween. The source/drain region 430 may surround a lower portion of each of the plurality of source/drain contacts 484 outside the contact hole 480H. In the source/drain region 430, each of the lower source/drain region 430L and the upper source/drain region 430R may include a portion in contact with the metal silicide film 482. Detailed configurations of the metal silicide film 482 and the source/drain contact 484 may be substantially the same as those of the metal silicide film 182 and the source/drain contact 184, which have been provided with reference to FIGS. 3A and 3B.

Figure 15:
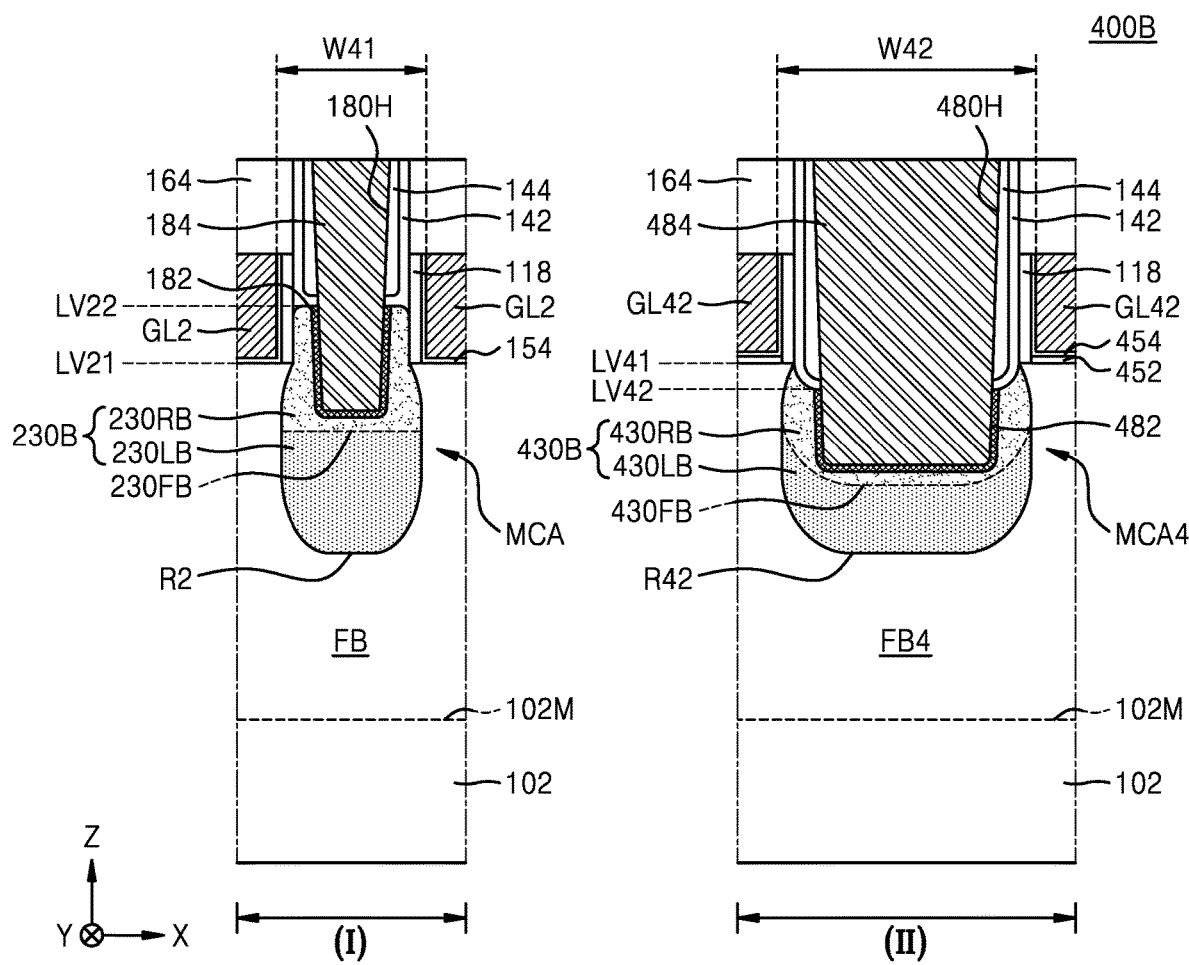
FIG. 15 shows cross-sectional views of an IC device according to embodiments.

FIG. 15 shows cross-sectional views of example configurations of an IC device 400B, which is a modified example of the IC device 400 shown in FIG. 13.

Referring to FIG. 15, the IC device 400B may have substantially the same configuration as the IC device 400 described with reference to FIGS. 12 and 13. However, in the IC device 400B, a first region I may include a structure having the same configuration as that described with reference to FIG. 10. A second region II may include a structure having a configuration similar to the structure of the second region II, which has been described with reference to FIG. 14. However, the IC device 400B may include a source/drain region 430B instead of the source/drain region 430 shown in FIG. 14 in a second region II.

The source/drain region 430B may have substantially the same configuration as the source/drain region 430 described with reference to FIG. 14. However, the source/drain region 430B may include a lower source/drain region 430LB and an upper source/drain region 430RB. The upper source/drain region 430RB may include a $^{28}$Si element at a content higher than a content of the $^{28}$Si element in the lower source/drain region 430LB.

The upper source/drain region 430RB may have a top surface, which is at a vertical level LV42 lower than a vertical LV41 of an uppermost surface of the main channel region MCA4. A boundary 430FB between the lower source/drain region 430LB and the upper source/drain region 430RB may be at a vertical level, which is lower than the vertical level LV41 of the uppermost surface of the main channel region MCA4 and lower than a vertical level of a lowermost portion of the metal silicide film 482. Each of the lower source/drain region 430LB and the upper source/drain region 430RB may include a portion in contact with the main channel region MCA4. The upper source/drain region 430RB may include a portion in a space between a pair of gate lines GL42.

In the source/drain region 430B, the lower source/drain region 430LB may be apart from the metal silicide film 482 with the upper source/drain region 430RB therebetween. The metal silicide film 482 may be in contact with only the upper source/drain region 430RB, from among the lower source/drain region 430LB and the upper source/drain region 430RB. Detailed compositions of constituent materials of the lower source/drain region 430LB and the upper source/drain region 430RB are respectively and substantially the same as those of the lower source/drain region 130L and the upper source/drain region 130R, which have been described with reference to FIGS. 2A, 2C, and 2D.

In an IC device according to embodiments, an upper local region of a source/drain region may include an upper source/drain region having an elevated top surface. Thus, a process of electrically connecting the source/drain region to a wiring structure (e.g., a source/drain contact) formed thereon may be easily performed during the manufacture of the IC device, Accordingly, the reliability of electrical connection between the source/drain region and the wiring structure connected to the source/drain region on the source/drain region may be improved. Therefore, the performance of an FET including the source/drain region may be improved, and the reliability of the IC device including the source/drain region may be improved.

FIGS. 16A to 16K are cross-sectional views of a process sequence of a method of manufacturing an IC device, according to embodiments. An example method of manufacturing the IC device 100 shown in FIGS. 1 and 2A to 2D will now be described with reference to FIGS. 16A to 16K. In FIGS. 16A to 16K, the same reference numerals are used to denote the same elements as in FIGS. 1 and 2A to 2D, and detailed descriptions thereof are omitted.

Figure 16A:
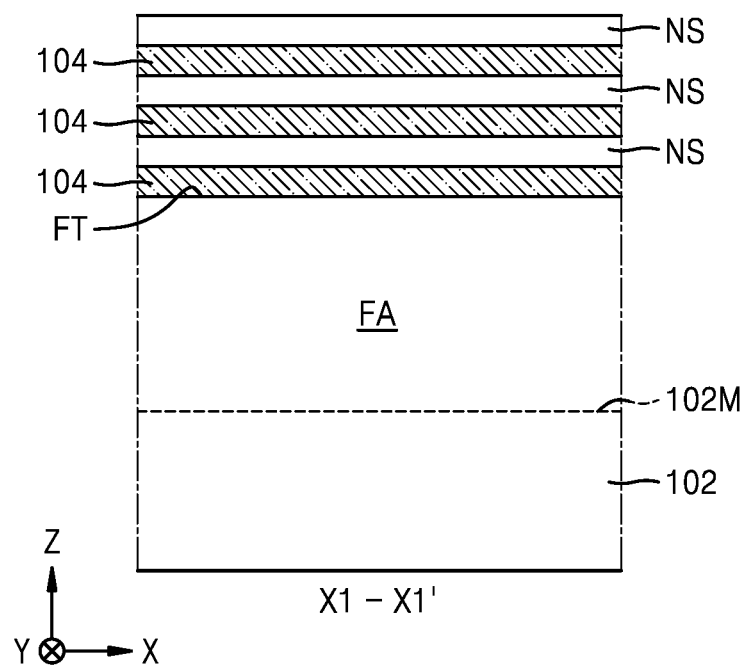
FIGS. 16A to 16K are cross-sectional views of a process sequence of a method of manufacturing an IC device, according to embodiments.

Referring to FIG. 16A, a plurality of sacrificial semiconductor layers 104 and a plurality of nanosheet semiconductor layers NS may be alternately stacked one by one on a substrate 102. Portions of the plurality of sacrificial semiconductor layers 104, the plurality of nanosheet semiconductor layers NS, and the substrate 102 may be etched to define a plurality of fin-type active regions FA in the substrate 102. Thereafter, a device isolation film (refer to 114 in FIG. 1) may be formed to cover sidewalls of each of the plurality of fin-type active regions FA. A top surface of the device isolation film 114 may be at substantially the same level as a fin top surface FT of each of the fin-type active regions FA. The stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 and the plurality of nanosheet semiconductor layers NS may include semiconductor materials having different etch selectivities. In embodiments, the plurality of nanosheet semiconductor layers NS may include a silicon (Si) layer, and the plurality of sacrificial semiconductor layers 104 may include a silicon germanium (SiGe) layer. In embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge concentration of the SiGe layer included in the plurality of sacrificial semiconductor layers 104 may be variously selected as needed.

Figure 16B:
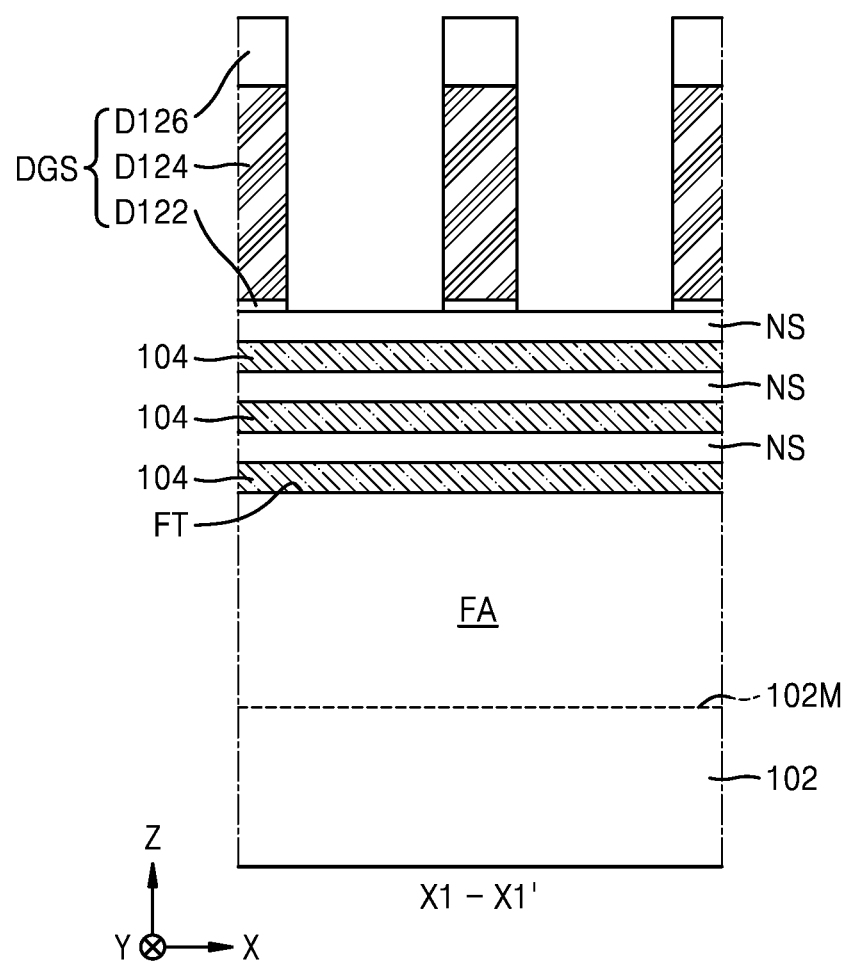

Referring to FIG. 16B, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend long in a second lateral direction (Y direction). Each of the plurality of dummy gate structures DGS may have a structure in which an oxide film D122, a dummy gate layer D124, and a capping layer D126 are sequentially stacked. In embodiments, the dummy gate layer D124 may include polysilicon, and the capping layer D126 may include a silicon nitride film. However, detailed compositions of constituent materials of the plurality of dummy gate structures DGS are not limited to the examples described above.

Figure 16C:
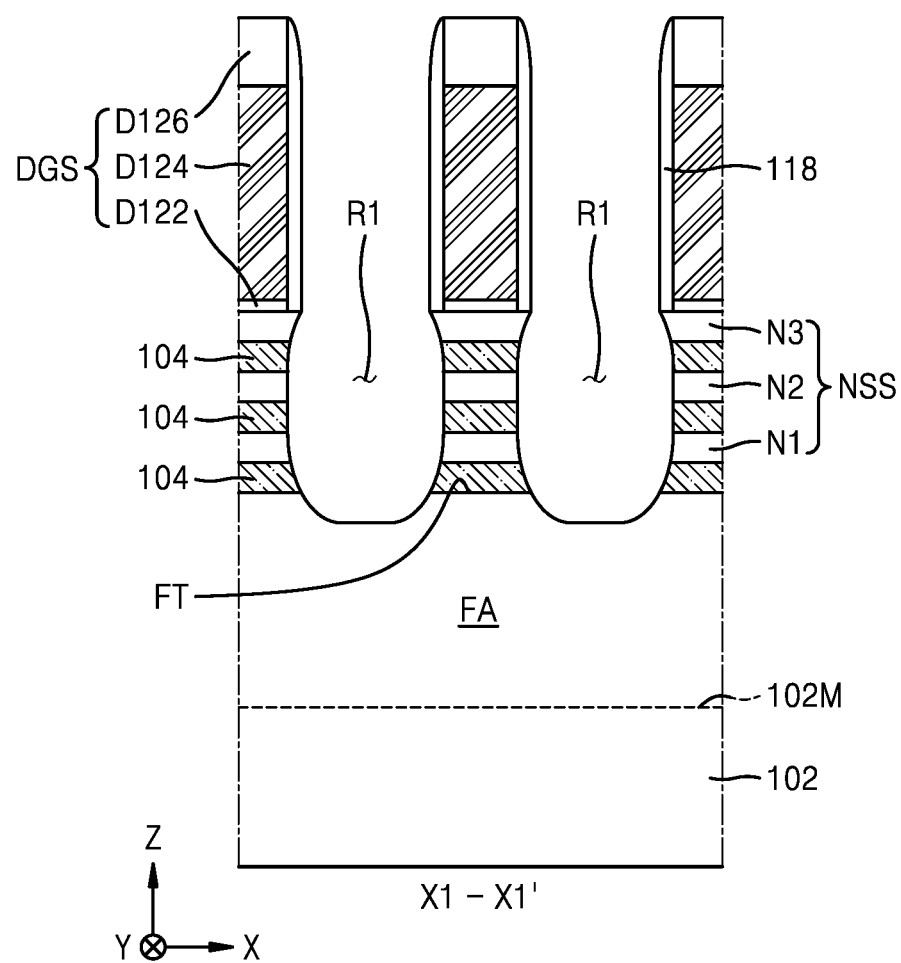

Referring to FIG. 16C, a plurality of outer insulating spacers 118 may be formed to cover both sidewalls of each of the plurality of dummy gate structures DGS. Thereafter, respective portions of the plurality of sacrificial semiconductor layers 104 and the plurality of nanosheet semiconductor layers NS and portions of the fin-type active region FA may be etched using the plurality of dummy gate structures DGS and the plurality of outer insulating spacers 118 as etch masks, and thus, the plurality of nanosheet semiconductor layers NS may be divided into a plurality of nanosheet stacks NSS, and a plurality of recesses R1 may be formed in an upper portion of the fin-type active region FA. Each of the plurality of nanosheet stacks NSS may include a first nanosheet N1, a second nanosheet N2, and a third nanosheet N3. The plurality of recesses R1 may be etched using a dry etching process, a wet etching process or a combination thereof.

Figure 16D:
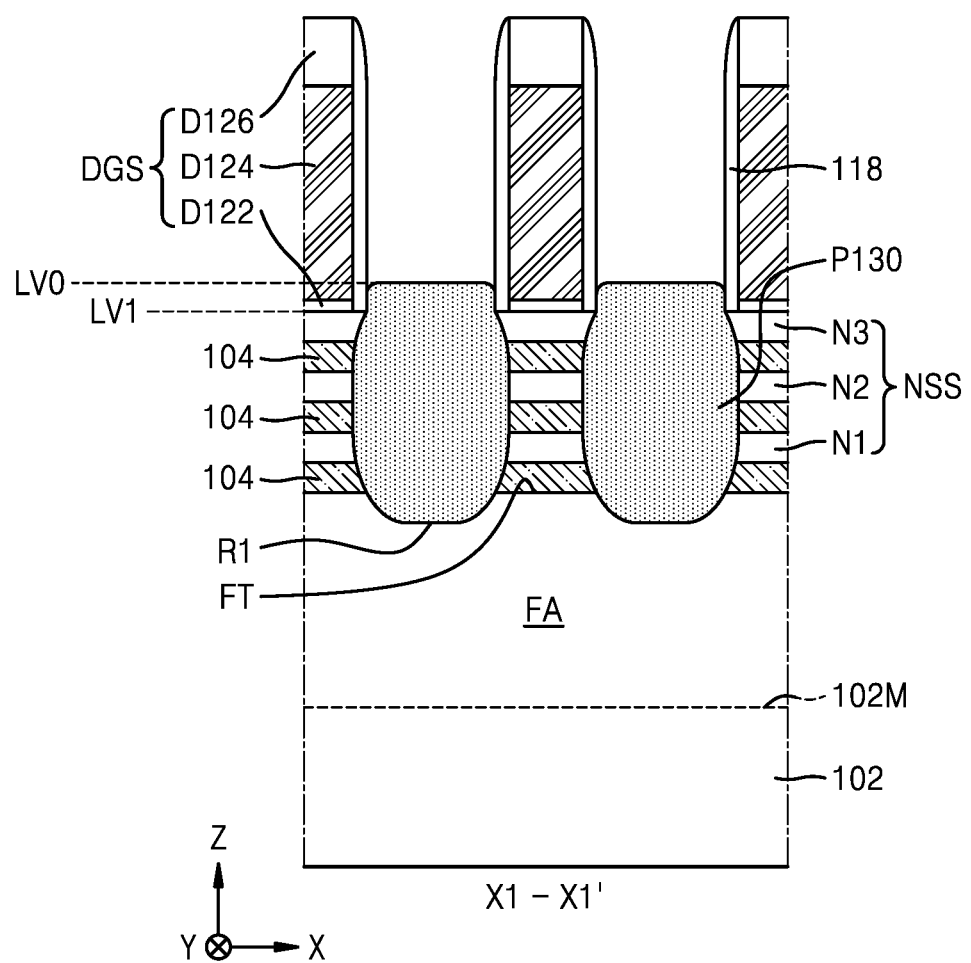

Referring to FIG. 16D, a plurality of preliminary source/drain regions P130 may be formed on both sides of each of the plurality of nanosheet stacks NSS on the fin-type active region FA.

In embodiments, the plurality of preliminary source/drain regions P130 may include a silicon layer doped with an n-type dopant, a silicon carbide (SiC) layer doped with an n-type dopant, or a silicon germanium (SiGe) layer doped with a p-type dopant. The plurality of preliminary source/drain regions P130 may include at least one silicon isotope selected from silicon isotopes including $^{28}$Si, $^{29}$Si, and $^{30}$Si. A content of a $^{28}$Si element in the plurality of preliminary source/drain regions P130 may be similar to a content of the $^{28}$Si element in a silicon film existing in nature. For example, a content of the $^{28}$Si element in the plurality of preliminary source/drain regions P130 may be less than about 10 at %, less than about 15 at %, less than about 20 at %, less than about 25 at %, less than about 30 at %, or less than about 35 at %, without being limited thereto. After the plurality of preliminary source/drain regions P130 are formed, a vertical level LV0 of an uppermost surface of each of the plurality of preliminary source/drain regions P130 may be equal to or higher than a vertical level LV1 of an uppermost surface of the third nanosheet N3.

In embodiments, to form the plurality of preliminary source/drain regions P130, a semiconductor material may be epitaxially grown from a surface of the fin-type active region FA exposed at a bottom surface of the recess R1, sidewalls of each of the first nanosheet N1, the second nanosheet N2, and the third nanosheet N3, and sidewalls of each of the plurality of sacrificial semiconductor layers 104.

In embodiments, to form the plurality of preliminary source/drain regions P130, a low-pressure chemical vapor deposition (LPCVD) process, a selective epitaxial growth (SEG) process, or a cyclic deposition and etching (CDE) process may be performed by using source materials including an element semiconductor precursor. The element semiconductor precursor may include an element, such as silicon (Si) and germanium (Ge).

In embodiments, the plurality of preliminary source/drain regions P130 may include a SiGe layer doped with a p-type dopant. To form the SiGe layer doped with the p-type dopant, a Si source and a Ge source may be used. Silane (SiH$_4$), disilane (Si$_2$H$_6$), trisilane (Si$_3$H$_8$), and/or dichlorosilane (SiH$_2$Cl$_2$) may be used as the silicon source. Germane (GeH$_4$), digermane (Ge$_2$H$_6$), trigermane (Ge$_3$H$_8$), tetragermane (Ge$_4$H$_{10}$), and/or dichlorogermane (Ge$_2$H$_2$Cl$_2$) may be used as the Ge source. The p-type dopant may be selected from boron (B) and gallium (Ga).

In other embodiments, the plurality of preliminary source/drain regions P130 may include the silicon layer doped with the n-type dopant. To form the silicon layer doped with the n-type dopant, at least one of the Si sources described above may be used. The n-type dopant may be selected from phosphorus (P), arsenic (As), and antimony (Sb). However, detailed compositions of constituent materials of the plurality of preliminary source/drain regions P130 are not limited to the examples described above.

Figure 16E:
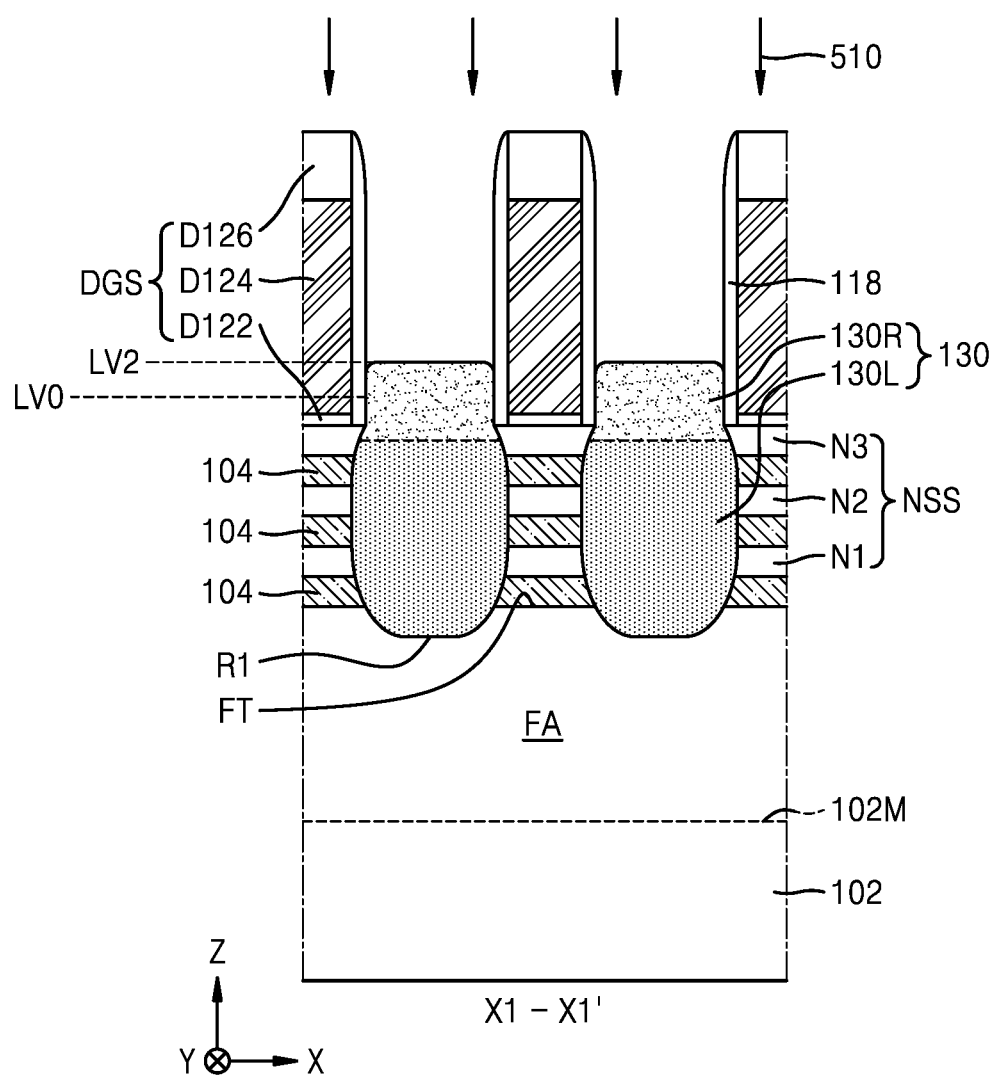

Referring to FIG. 16E, in the resultant structure of FIG. 16D in which the plurality of preliminary source/drain regions P130 are formed, $^{28}$Si element ions 510 may be implanted into an upper portion of each of the plurality of preliminary source/drain regions P130 by using the plurality of dummy gate structures DGS as ion implantation masks. As a result, a plurality of source/drain regions 130, each of which includes a lower source/drain region 130L and an upper source/drain region 130R, may be obtained from the plurality of preliminary source/drain regions P130.

In each of the plurality of source/drain regions 130, the upper source/drain region 130R may be a region of the preliminary source/drain region P130 of FIG. 16D, into which the $^{28}$Si element ions 510 are implanted or more heavily implanted than the lower source/drain region 130L. Specifically, the upper source/drain region 130R may be a resultant obtained by swelling a volume of an upper partial region of the preliminary source/drain region P130 due to the $^{28}$Si element ions 510 implanted into the upper partial region of the preliminary source/drain region P130. In each of the plurality of source/drain regions 130, the lower source/drain region 130L may be a region of the preliminary source/drain region P130 of FIG. 16D, into which the $^{28}$Si element ions 510 are not implanted or less heavily implanted than the upper source/drain region 130R. Thus, the lower source/drain region 130L may not be affected or barely affected by the $^{28}$Si element ions 510. In each of the plurality of source/drain regions 130, the upper source/drain region 130R may have a top surface at a vertical level LV2, which is higher than the vertical level LV1 of the uppermost surface of the third nanosheet N3.

In embodiments, to implant the $^{28}$Si element ions 510 into an upper portion of each of the plurality of preliminary source/drain regions P130, SiF$_4$, SiH$_4$, and/or Si$_2$H$_6$ may be used as a silicon source, without being limited thereto. The process of implanting the $^{28}$Si element ions 510 into the upper portion of each of the plurality of preliminary source/drain regions P130 may be performed under various temperature conditions. In embodiments, the process of implanting the $^{28}$Si element ions 510 into the upper portion of each of the plurality of preliminary source/drain regions P130 may be performed at room temperature, for example, at a temperature of about 1° C. to about 35° C., without being limited thereto.

In each of the plurality of source/drain regions 130 obtained by performing the process described with reference to FIG. 16E, at least a portion of the upper source/drain region 130R obtained by implanting the $^{28}$Si element ions 510 may include a portion amorphized by implanting the $^{28}$Si element ions 510. The amorphized portion of each of the plurality of source/drain regions 130 may be crystallized through various subsequent processes involving heat.

As described with reference to FIG. 16E, the plurality of source/drain regions 130, each of which includes the upper source/drain region 130R having an uppermost surface of which a vertical level is elevated, may be formed from the plurality of preliminary source/drain regions P130. Thus, of each of the preliminary source/drain regions (refer to P130 in FIG. 16D), a main portion for applying desired stress to a channel region may not be adversely affected by the $^{28}$Si element ions 510 but left as the lower source/drain region 130L. When an etching process for forming a contact hole for forming a source/drain contact (e.g., a contact hole 180H for forming the source/drain contact 184 shown in FIG. 3A) on the source/drain region 130 is performed in a subsequent process, a sufficient etching margin by which the contact hole may reach the inside of the source/drain region 130 may be provided by the upper source/drain region 130R. Therefore, the plurality of source/drain regions 130 may contribute toward improving the reliability of the IC device obtained as a final resultant structure.

Figure 16F:
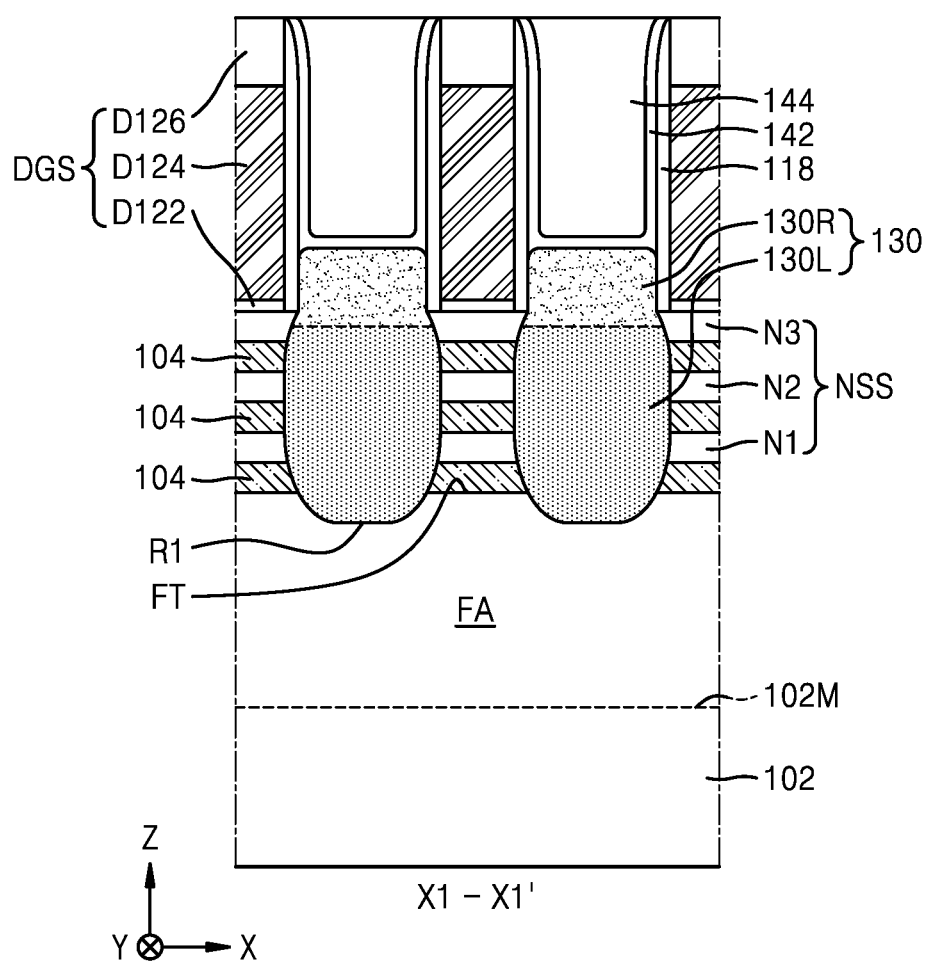

Referring to FIG. 16F, an insulating liner 142 may be formed to cover the resultant structure of FIG. 16E in which the plurality of source/drain regions 130 are formed, and an inter-gate dielectric film 144 may be formed on the insulating liner 142. The insulating liner 142 and the inter-gate dielectric film 144 may be planarized to expose a top surface of the capping layer D126.

Figure 16G:
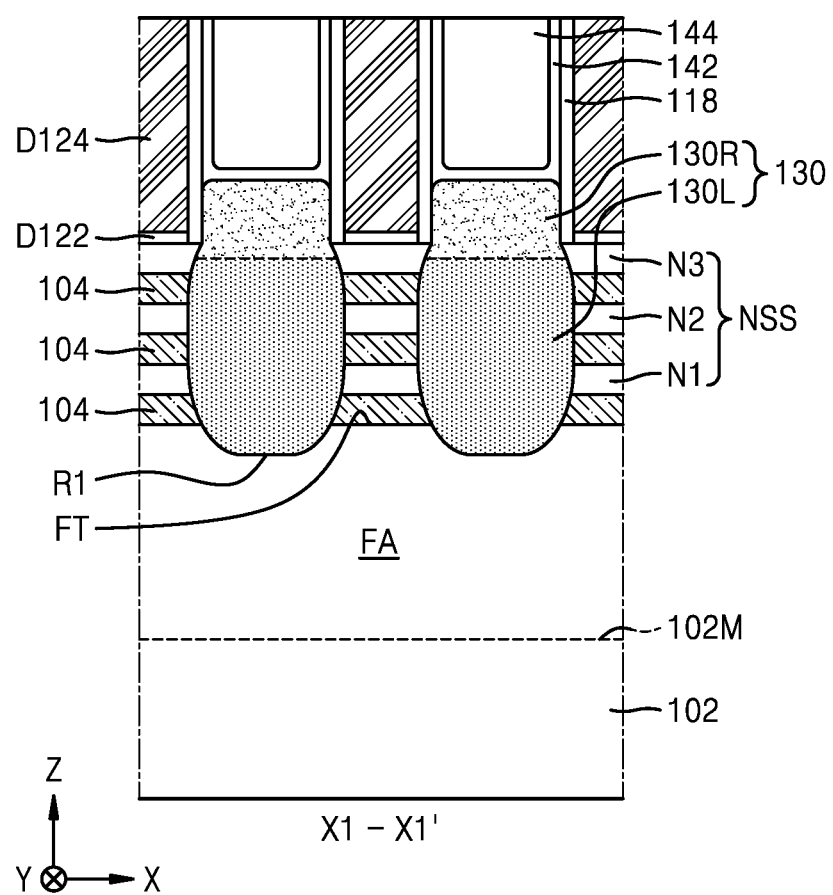

Referring to FIG. 16G, the capping layer D126 may be removed from the resultant structure of FIG. 16F to expose a top surface of the dummy gate layer D124. The insulating liner 142 and the inter-gate dielectric film 144 may be partially removed such that a top surface of the inter-gate dielectric film 144 becomes at substantially the same level as the top surface of the dummy gate layer D124.

Figure 16H:
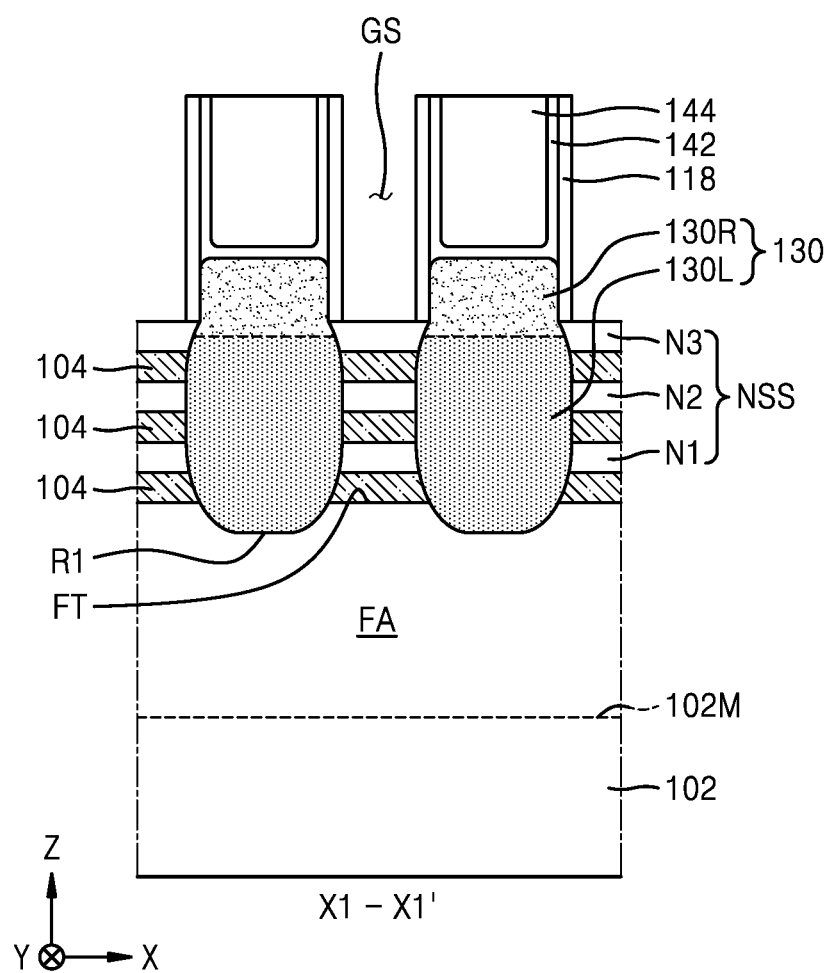

Referring to FIG. 16H, the dummy gate layer D124 and the oxide film D122 located thereunder may be removed from the resultant structure of FIG. 16G to prepare a gate space GS, and the plurality of nanosheet stacks NSS may be exposed through the gate space GS.

Figure 16I:
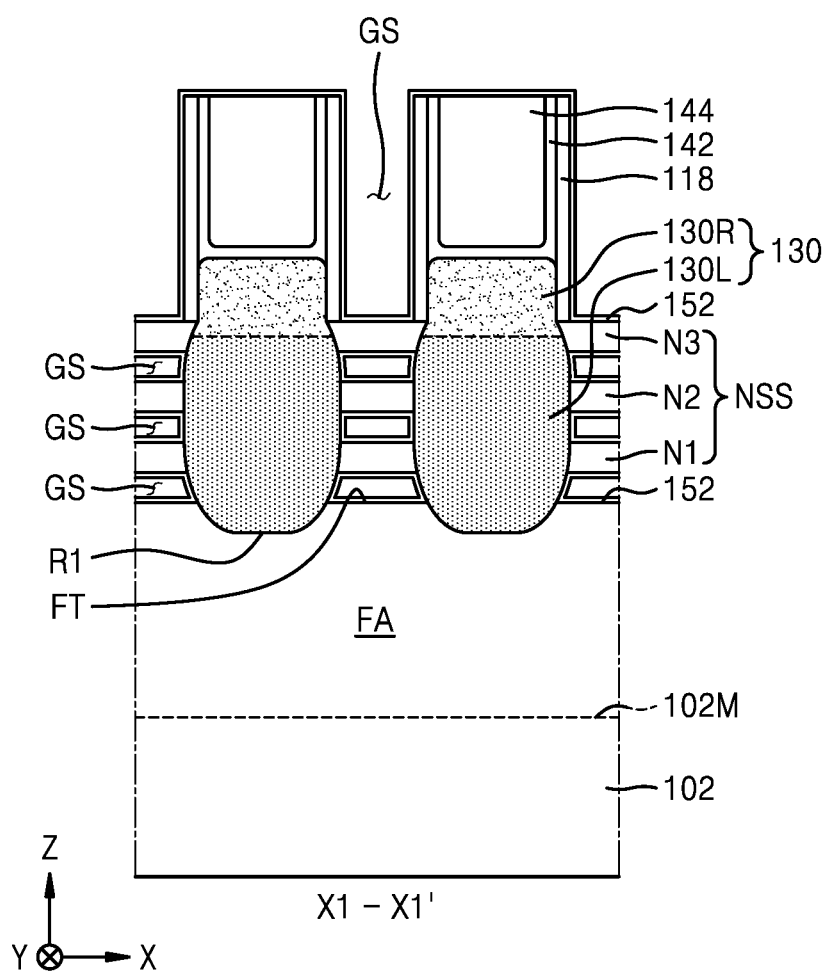

Referring to FIG. 16I, in the resultant structure of FIG. 16H, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT.

In embodiments, to selectively remove the plurality of sacrificial semiconductor layers 104, etch selectivities of the first to third nanosheets N1, N2, and N3 with respect to the plurality of sacrificial semiconductor layers 104 may be used. A liquid or gaseous etchant may be used to selectively remove the plurality of sacrificial semiconductor layers 104. In embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Thereafter, a gate dielectric film 152 may be formed to cover respective exposed surfaces of the first to third nanosheets N1, N2, and N3 and the fin-type active region FA. The gate dielectric film 152 may be formed using an atomic layer deposition (ALD) process.

Figure 16J:
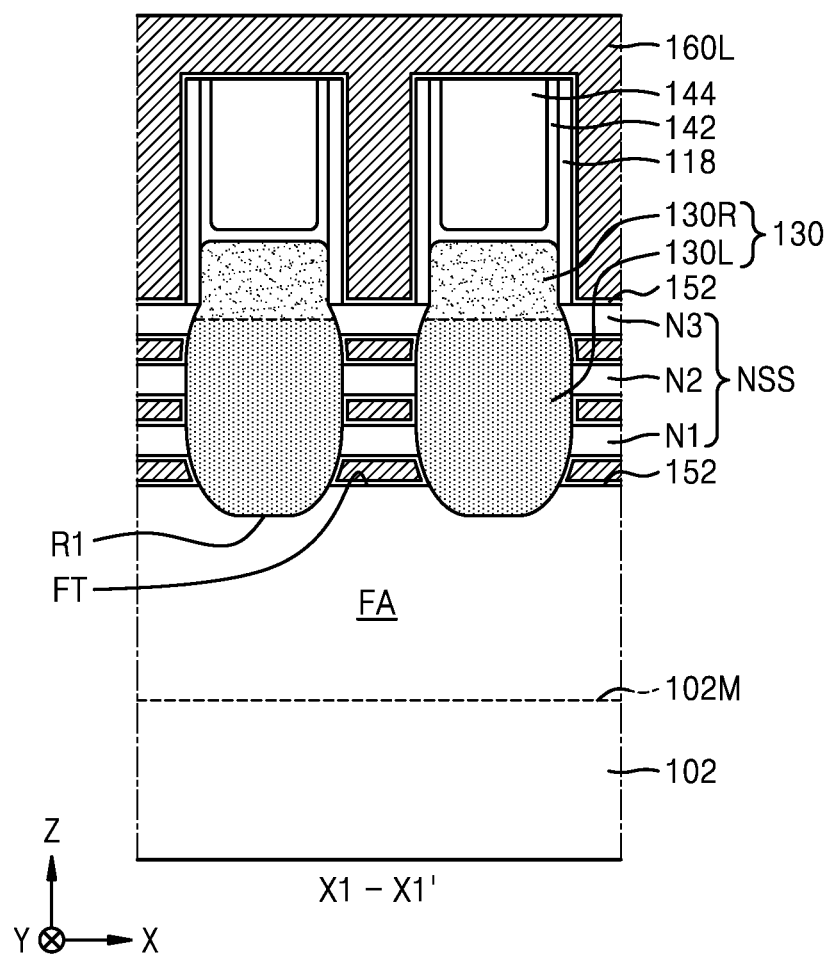

Referring to FIG. 16J, on the resultant structure of FIG. 16I, a gate-forming conductive layer 160L filling the gate space refer to GS in FIG. 16H) and covering the top surface of the inter-gate dielectric film 144 may be formed on the gate dielectric film 152. The gate-forming conductive layer 160L may include a metal, a metal nitride, a metal carbide, or a combination thereof. The gate-forming conductive layer 160L may be formed using an ALD process or a CVD process.

Figure 16K:
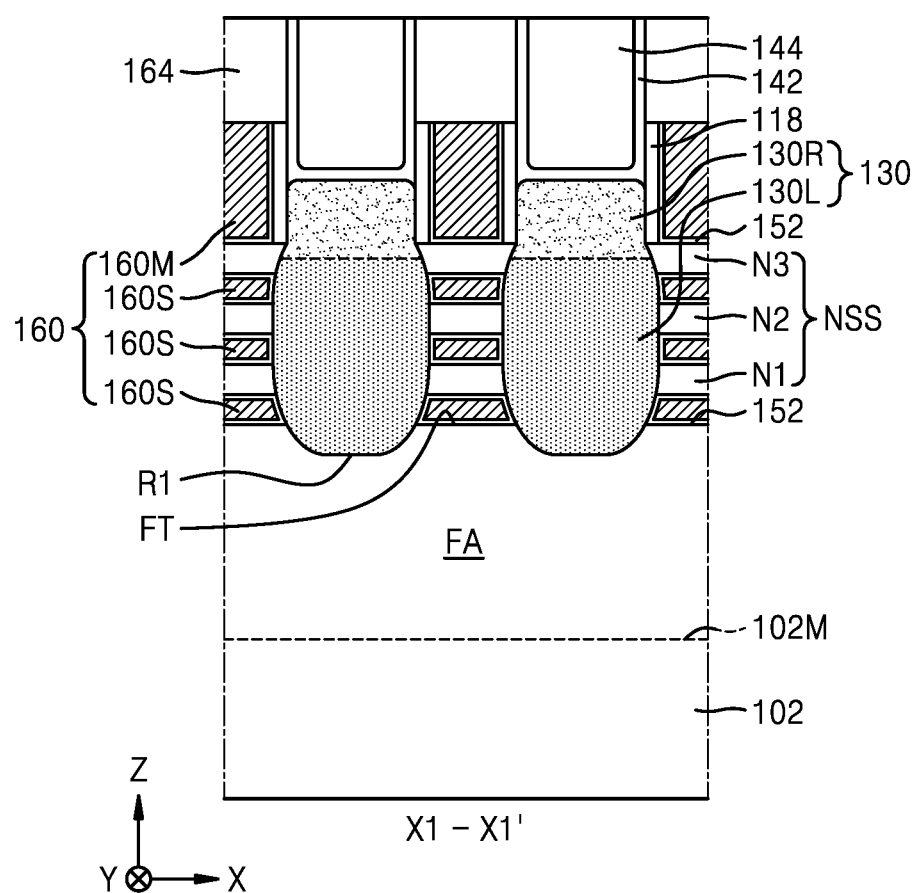

Referring to FIG. 16K, in the resultant structure of FIG. 16J, the gate-forming conductive layer 160L and the gate dielectric film 152 may be partially removed from top surfaces thereof to expose the top surface of the inter-gate dielectric film 144 and empty an upper portion of the gate space GS again to form a gate line 160. In this case, an upper portion of each of a plurality of outer insulating spacers 118 may also be consumed, and thus, a height of each of the plurality of outer insulating spacers 118 may be reduced. Thereafter, a capping insulating pattern 164 filling the gate space GS may be formed on the gate line 160.

Although the method of manufacturing the IC device 100 shown in FIGS. 1 and 2A to 2D, according to the embodiment, have been described with reference to FIGS. 16A to 16K, it will be understood that the IC devices 100A, 100B, 100C, 100D, 200, 200A, 200B, 300, 400, 400A, and 400B shown in FIGS. 3A to 15 and IC devices having various structures may be manufactured by making various modifications and changes within the scope of the inventive concept.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a fin-type active region extending long in a first lateral direction on a substrate;
   a channel region on the fin-type active region;
   a gate line on the channel region on the fin-type active region, the gate line extending long in a second lateral direction, wherein the second lateral direction intersects with the first lateral direction; and
   a source/drain region adjacent to the gate line on the fin-type active region, the source/drain region having a sidewall facing the channel region,
   wherein the source/drain region comprises:
   a lower source/drain region having a bottom surface in contact with the fin-type active region, the lower source/drain region comprising at least one silicon isotope selected from silicon isotopes comprising $^{28}Si$, $^{29}Si$, and $^{30}Si$; and
   an upper source/drain region that is integral to the lower source/drain region on the lower source/drain region, the upper source/drain region comprising a second content of $^{28}Si$ that is higher than a first content of $^{28}Si$ in the lower source/drain region.

2. The integrated circuit device of claim 1, wherein the upper source/drain region has a top surface that is higher than an uppermost surface of the channel region relative to the substrate.

3. The integrated circuit device of claim 1, wherein the upper source/drain region has a top surface that is lower than an uppermost surface of the channel region relative to the substrate.

4. The integrated circuit device of claim 1, wherein each of the lower source/drain region and the upper source/drain region comprises single crystalline silicon doped with an n-type dopant,
   the lower source/drain region comprises $^{28}Si$ at the first content higher than about 0 at %, and
   the upper source/drain region comprises $^{28}Si$ at the second content higher than the first content.

5. The integrated circuit device of claim 1, wherein each of the lower source/drain region and the upper source/drain region comprises a silicon germanium (SiGe) layer doped with a p-type dopant,
   the lower source/drain region comprises $^{28}Si$ at the first content, and
   the upper source/drain region comprises $^{28}Si$ at the second content higher than the first content.

6. The integrated circuit device of claim 1, further comprising outer insulating spacers, each outer insulating spacer comprising a portion on a sidewall of the gate line and a portion in contact with the upper source/drain region.

7. The integrated circuit device of claim 1, wherein a boundary between the lower source/drain region and the upper source/drain region is lower than an uppermost surface of the channel region relative to the substrate.

8. The integrated circuit device of claim 1, further comprising:
   outer insulating spacers on sidewalls of the gate line;

an inter-gate dielectric film on the source/drain region and the outer insulating spacers; and a source/drain contact passing through the inter-gate dielectric film in a vertical direction on the source/drain region, the source/drain contact having a lower portion surrounded by the source/drain region, wherein the upper source/drain region extends between the outer insulating spacers and the source/drain contact.

9. The integrated circuit device of claim 1, further comprising:

outer insulating spacers on sidewalls of the gate line;

an inter-gate dielectric film on the source/drain region and the outer insulating spacers;

a source/drain contact passing through the inter-gate dielectric film on the source/drain region, the source/drain contact having a lower portion surrounded by the source/drain region; and a metal silicide film between the source/drain contact and the source/drain region, wherein the upper source/drain region comprises a first portion in contact with the outer insulating spacers and a second portion in contact with the metal silicide film.

10. The integrated circuit device of claim 1, further comprising:

outer insulating spacers on sidewalls of the gate line;

an inter-gate dielectric film on the source/drain region and the outer insulating spacers;

a source/drain contact passing through the inter-gate dielectric film in a vertical direction on the source/drain region, the source/drain contact having a lower portion surrounded by the source/drain region; and a metal silicide film between the source/drain contact and the source/drain region, wherein each of the lower source/drain region and the upper source/drain region comprises a portion in contact with the metal silicide film.

11. The integrated circuit device of claim 1, wherein the channel region comprises a nanosheet on the fin-type active region, the gate line comprises a portion on the nanosheet on the fin-type active region, and the upper source/drain region comprises a portion in contact with the nanosheet.

12. The integrated circuit device of claim 1, wherein the channel region comprises a main channel region that is integral to the fin-type active region on the fin-type active region, and the upper source/drain region comprises a portion in contact with the main channel region.

13. An integrated circuit device comprising:

a fin-type active region extending long in a first lateral direction on a substrate;

a recess in the fin-type active region;

a pair of channel regions on the fin-type active region with the recess therebetween;

a pair of gate lines extending long in a second lateral direction on the fin-type active region, the pair of gate lines being spaced apart from each other in the first lateral direction with the recess therebetween, wherein the second lateral direction intersects with the first lateral direction; and a source/drain region in the recess, the source/drain region being in contact with the pair of channel regions, wherein the source/drain region comprises:

a lower source/drain region having a bottom surface in contact with the fin-type active region, the lower source/drain region comprising at least one silicon isotope selected from silicon isotopes comprising $^{28}Si$, $^{29}Si$, and $^{30}Si$; and an upper source/drain region that is integral to the lower source/drain region on the lower source/drain region, the upper source/drain region comprising a second content of $^{28}Si$ that is higher than a first content of the $^{28}Si$ in the lower source/drain region.

14. The integrated circuit device of claim 13, wherein the upper source/drain region extends between the pair of gate lines.

15. The integrated circuit device of claim 13, wherein a boundary between the lower source/drain region and the upper source/drain region is lower than an uppermost surface of each of the pair of channel regions relative to the substrate.

16. The integrated circuit device of claim 13, further comprising a source/drain contact extending long in a vertical direction between the pair of gate lines, the source/drain contact having a lower portion surrounded by the source/drain region, wherein the upper source/drain region extends between at least one gate line of the pair of gate lines and the source/drain contact.

17. The integrated circuit device of claim 13, further comprising:

a source/drain contact extending long in a vertical direction between the pair of gate lines, the source/drain contact having a lower portion surrounded by the source/drain region; and a metal silicide film between the source/drain contact and the source/drain region, wherein the lower source/drain region is spaced apart from the metal silicide film with the upper source/drain region therebetween, and the upper source/drain region comprises a portion in contact with the metal silicide film.

18. The integrated circuit device of claim 13, further comprising:

a source/drain contact extending long in a vertical direction between the pair of gate lines, the source/drain contact having a lower portion surrounded by the source/drain region; and a metal silicide film between the source/drain contact and the source/drain region, wherein each of the lower source/drain region and the upper source/drain region comprises a portion in contact with the metal silicide film.

19. An integrated circuit device comprising:

a plurality of fin-type active regions extending long in a first lateral direction on a substrate;

a plurality of recesses in upper portions of the plurality of fin-type active regions, respectively;

a plurality of channel regions on the plurality of fin-type active regions;

a plurality of gate lines on the plurality of channel regions, the plurality of gate lines extending long in a second lateral direction, wherein the second lateral direction intersects with the first lateral direction;

a plurality of source/drain regions in the plurality of recesses;

a plurality of source/drain contacts on the plurality of source/drain regions, each of the source/drain contacts having a lower portion surrounded by a respective one of the plurality of source/drain regions; and a plurality of metal silicide films between the plurality of source/drain regions and the plurality of source/drain contacts, respectively, wherein each of the plurality of source/drain regions comprises:

a lower source/drain region having a bottom surface in contact with a respective one of the plurality of fin-type active regions, the lower source/drain region comprising at least one silicon isotope selected from silicon isotopes comprising $^{28}$Si, $^{29}$Si, and $^{30}$Si; and an upper source/drain region that is integral to the lower source/drain region on the lower source/drain region, the upper source/drain region comprising a second content of $^{28}$Si that is higher than a first content of the $^{28}$Si in the lower source/drain region.

20. The integrated circuit device of claim 19, wherein the plurality of fin-type active regions comprises a first fin-type active region in a first region of the substrate and a second fin-type active region in a second region of the substrate, the plurality of gate lines comprises a pair of first gate lines on the first fin-type active region in the first region and a pair of second gate lines on the second fin-type active region in the second region, wherein the pair of first gate lines are a first distance apart from each other, the pair of second gate lines are a second distance apart from each other, and the second distance is greater than the first distance, the plurality of source/drain regions comprises a first source/drain region between the pair of first gate lines in the first region and a second source/drain region between the pair of second gate lines in the second region, the upper source/drain region of the first source/drain region extends between the pair of first gate lines, and the upper source/drain region of the second source/drain region does not extend between the pair of second gate lines.

* * * * *